(12) United States Patent
Costa et al.

(10) Patent No.: US 8,923,054 B1
(45) Date of Patent: Dec. 30, 2014

(54) PSEUDO BLOCK OPERATION MODE IN 3D NAND

(71) Applicant: SanDisk Technologies Inc., Plano, TX (US)

(72) Inventors: Xiying Costa, San Jose, CA (US); Alexander Kwog-Tung Mak, Los Altos Hills, CA (US); Chris Avila, Saratoga, CA (US); Gautam Dusija, San Jose, CA (US); Man Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/152,848

(22) Filed: Jan. 10, 2014

Related U.S. Application Data

(60) Provisional application No. 61/835,259, filed on Jun. 14, 2013.

(51) Int. Cl.
*G11C 16/04* (2006.01)
*G11C 16/10* (2006.01)
*G11C 16/16* (2006.01)

(52) U.S. Cl.
CPC .......... *G11C 16/107* (2013.01); *G11C 16/0483* (2013.01); *G11C 16/16* (2013.01)
USPC ............ 365/185.11; 365/185.17; 365/185.05; 365/185.14; 365/185.29; 365/189.09

(58) Field of Classification Search
CPC ........... G11C 16/0483; G11C 16/0408; G11C 16/0466; G11C 16/16; G11C 11/5621; G11C 11/5628; G11C 11/5642
USPC ............ 365/185.17, 185.05, 185.21, 185.14, 365/185.29, 189.09
See application file for complete search history.

(56) References Cited

U.S. PATENT DOCUMENTS

| | | | |
|---|---|---|---|
| 5,995,417 A | 11/1999 | Chen et al. | |
| 7,804,718 B2 | 9/2010 | Kim | |
| 8,488,382 B1 | 7/2013 | Li et al. | |
| 2006/0256623 A1 | 11/2006 | Roohparvar | |
| 2011/0199833 A1 | 8/2011 | Shim et al. | |
| 2013/0100737 A1 | 4/2013 | Kwak | |
| 2013/0163336 A1 | 6/2013 | Li et al. | |
| 2013/0201760 A1 | 8/2013 | Dong et al. | |
| 2014/0192596 A1* | 7/2014 | Rhie | 365/185.17 |

OTHER PUBLICATIONS

Response to Office Action mailed Jul. 22, 2014 for U.S. Appl. No. 14/274,440, filed Aug. 25, 2014.
Office Action mailed Jul. 22, 2014 for U.S. Appl. No. 14/274,440.
Notice of Allowance dated Sep. 18, 2014, U.S. Appl. No. 14/274,440, filed May 9, 2014.
International Search Report & The Written Opinion of the International Searching Authority dated Sep. 19, 2014, International Application No. PCT/US2014/042120.

\* cited by examiner

*Primary Examiner* — Thong Q Le
(74) *Attorney, Agent, or Firm* — Vierra Magen Marcus LLP

(57) ABSTRACT

A 3D NAND stacked non-volatile memory device, comprising: a string comprising a plurality of non-volatile storage elements, the string comprises a channel and extends vertically through layers of the 3D stacked non-volatile memory device, and the plurality of storage elements are subdivided into different groups based on group assignments, each group of the different groups comprises multiple adjacent storage elements of the plurality of storage elements; and a control circuit in communication with the string, the control circuit, to perform a Pseudo Block Operation Mode.

29 Claims, 26 Drawing Sheets

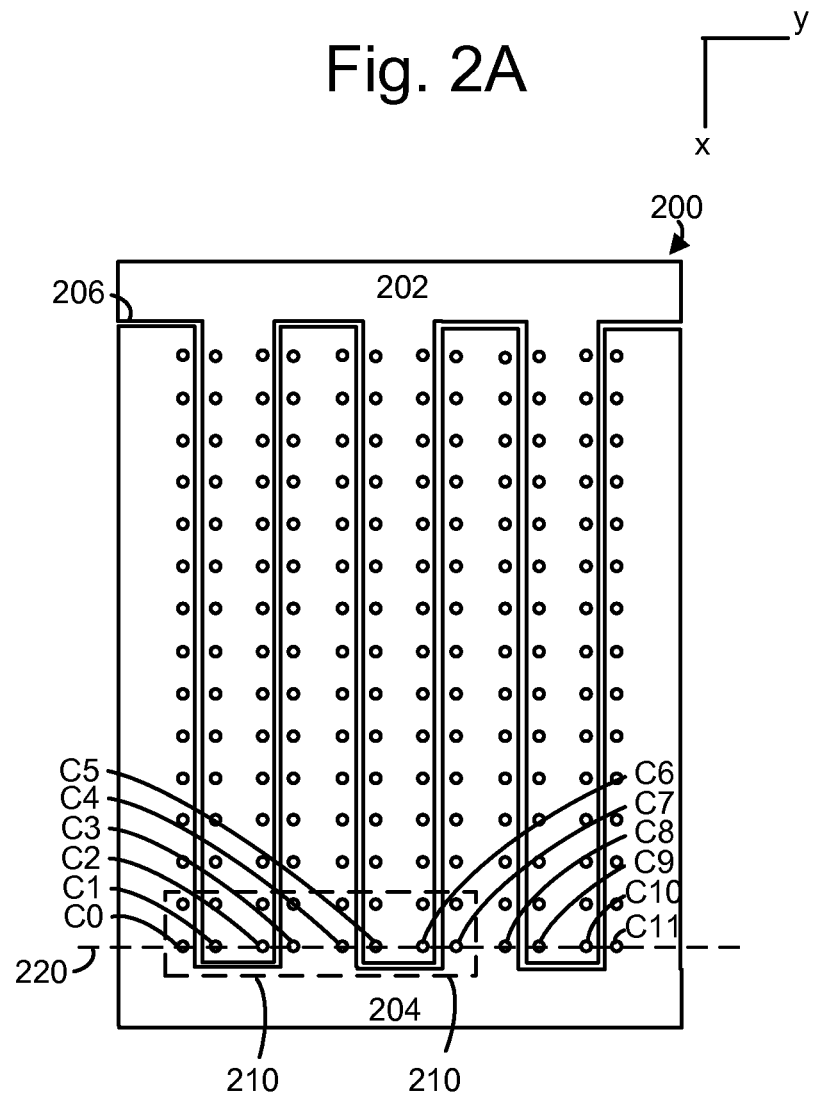

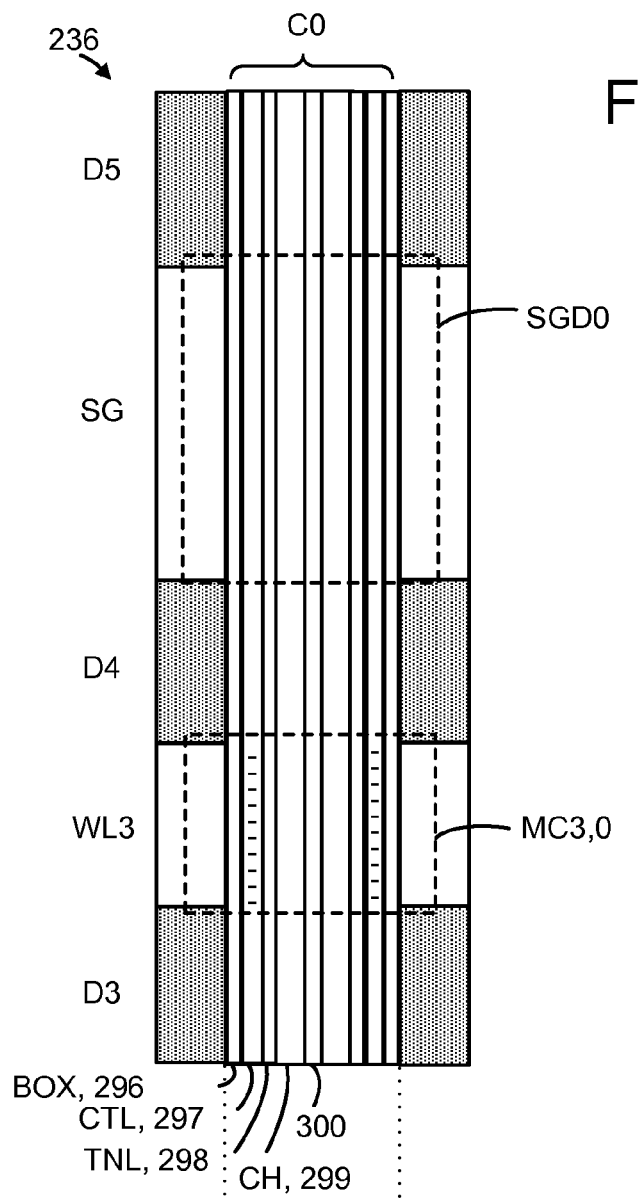
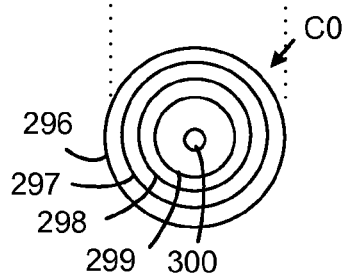
Fig. 3A
Fig. 3B

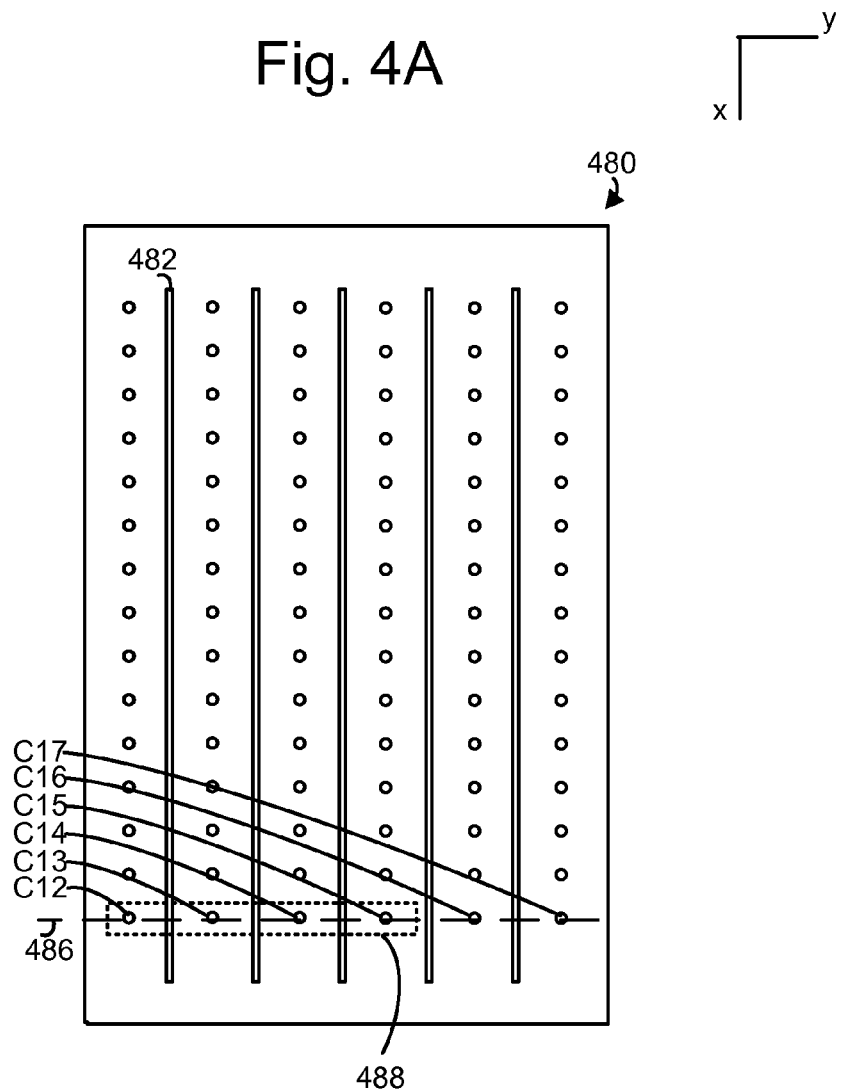

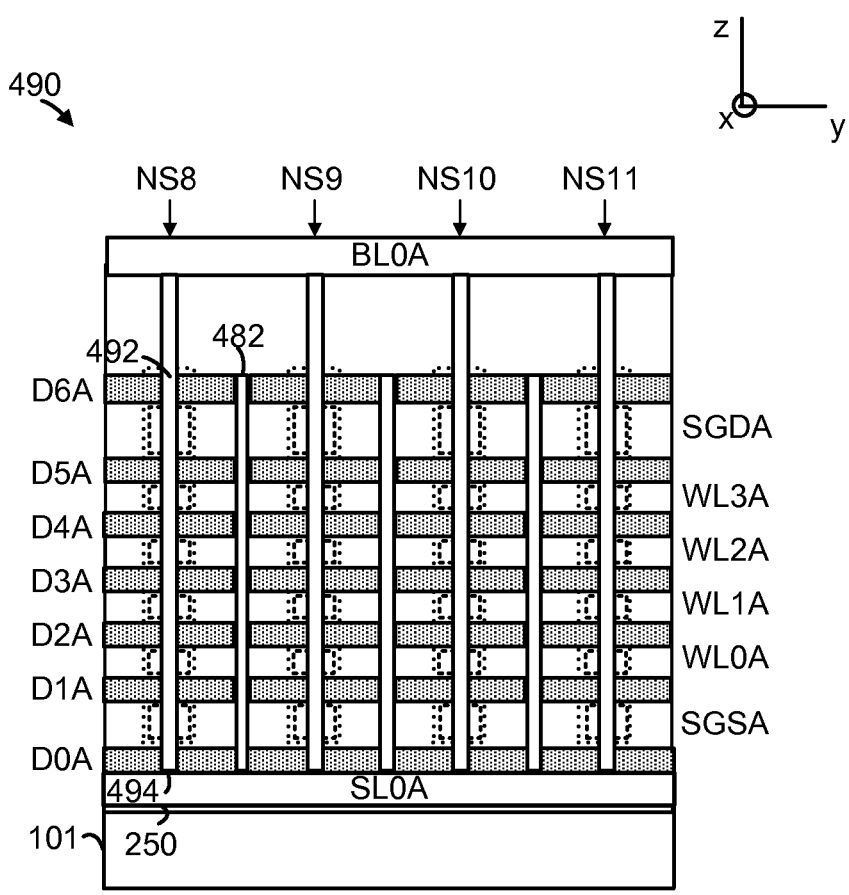

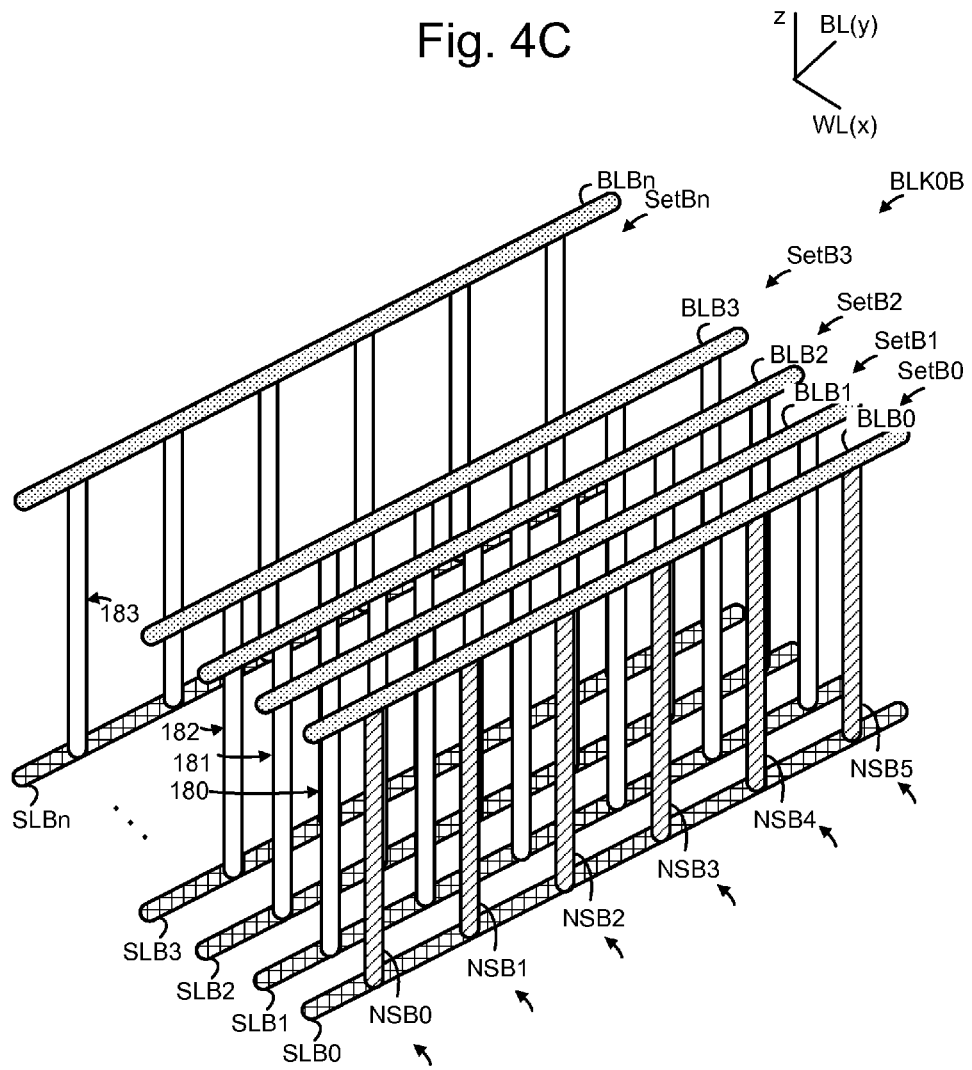

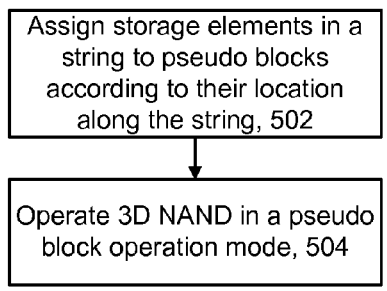
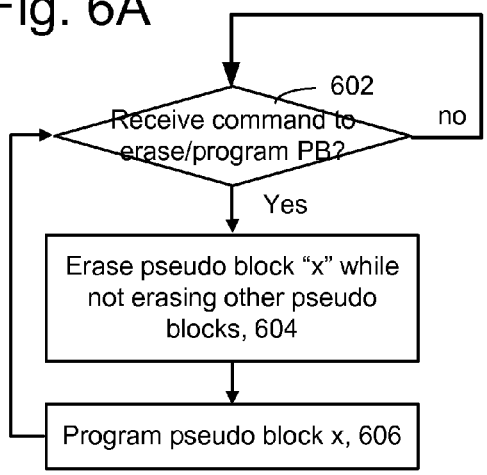
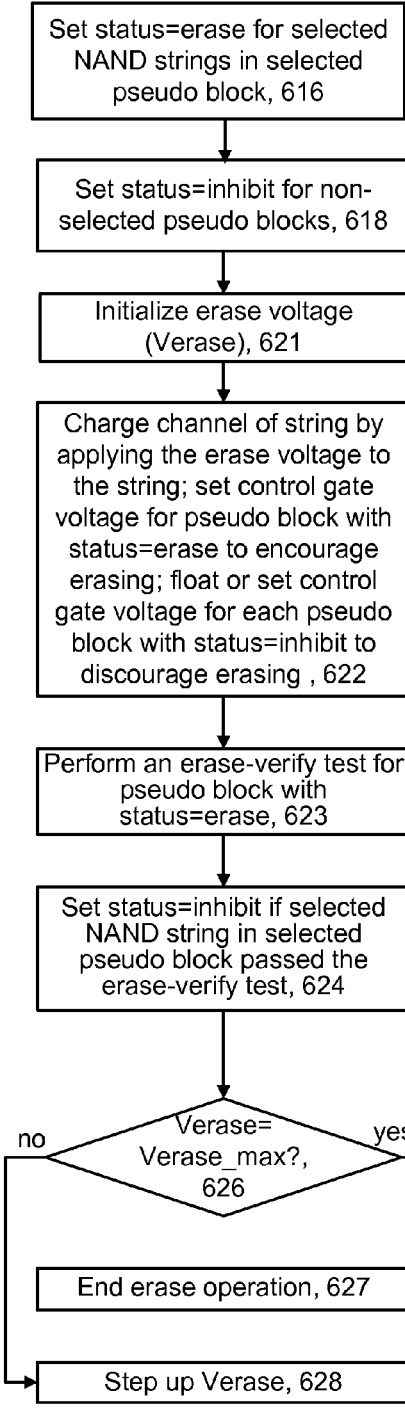

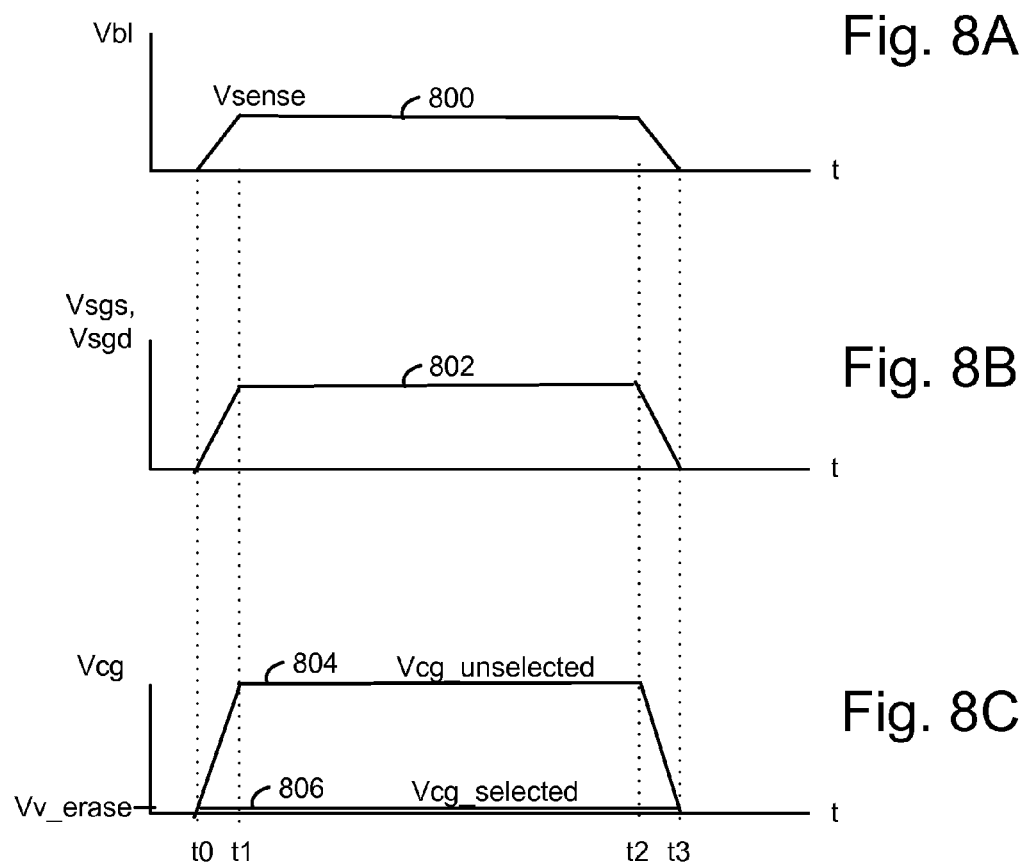

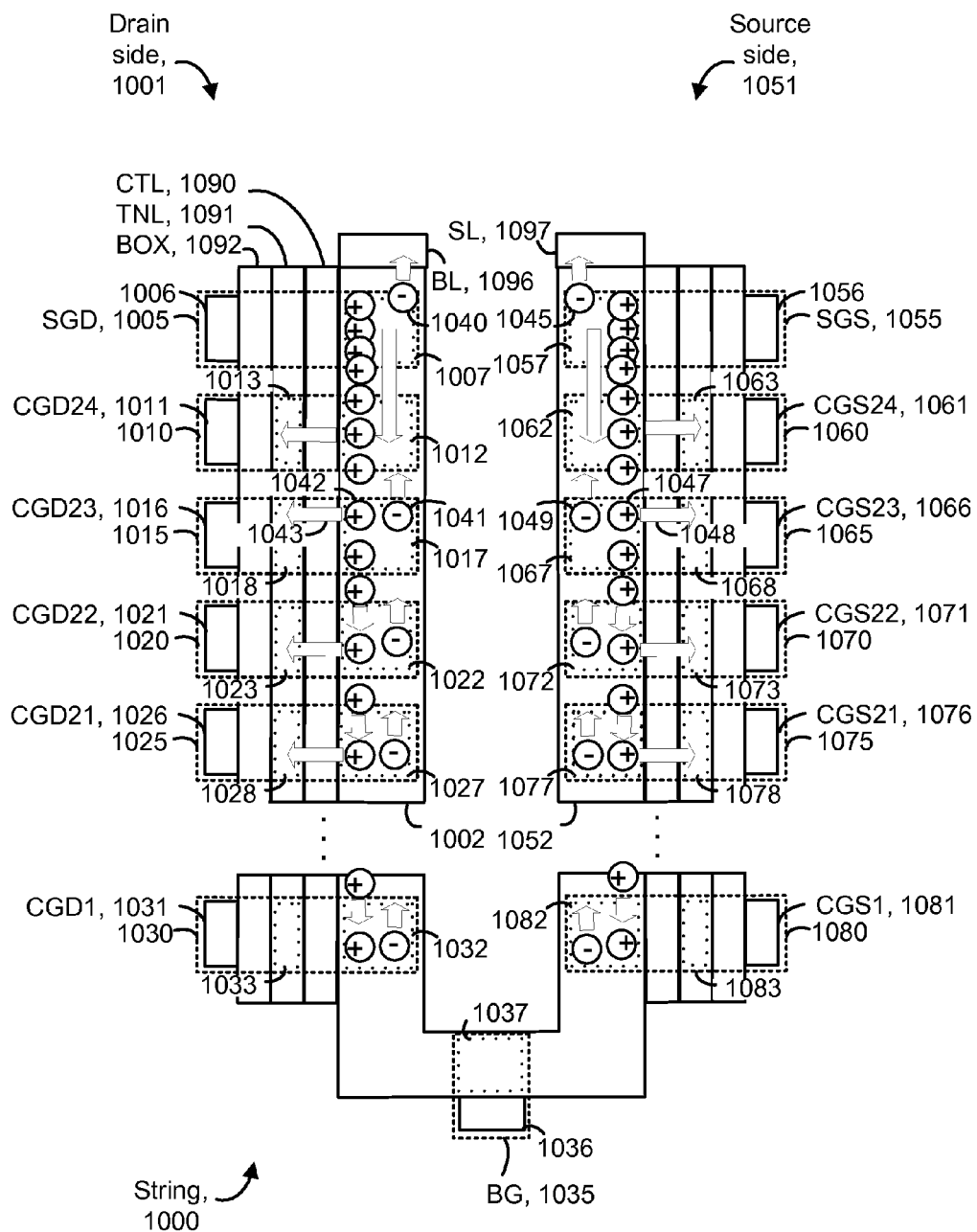

Fig. 12B
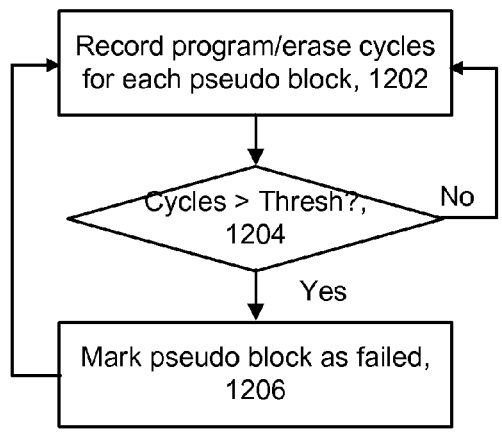
Fig. 12C
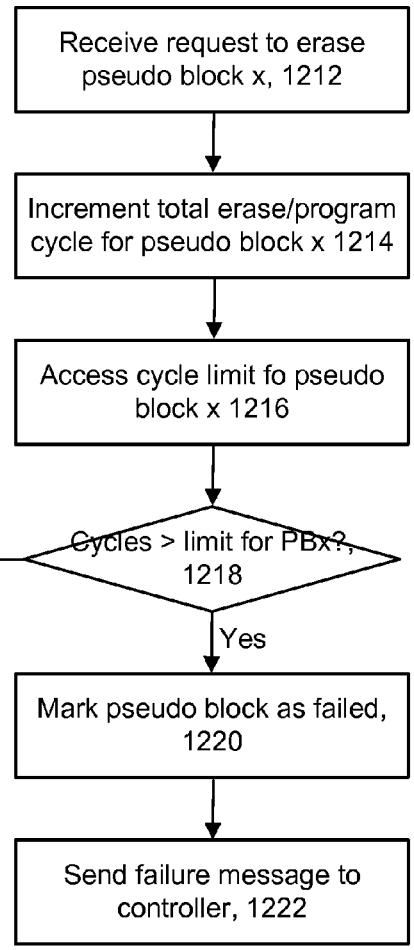
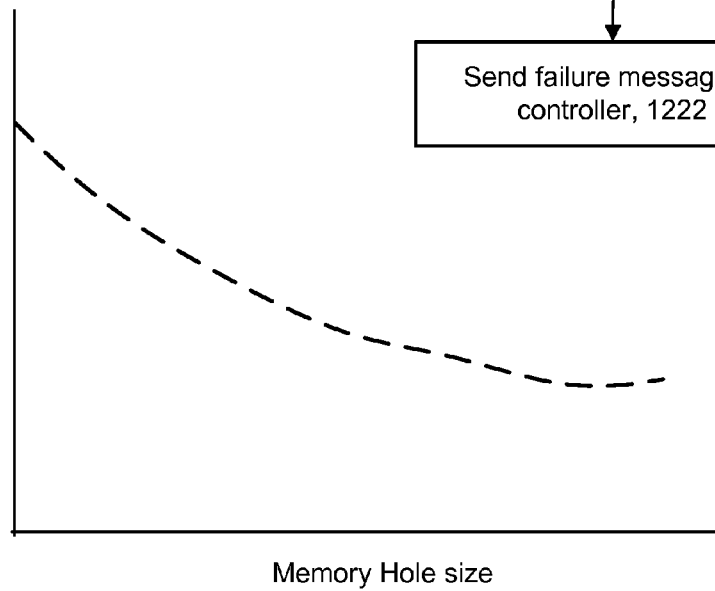
Fig. 12A

PSEUDO BLOCK OPERATION MODE IN 3D NAND

PRIORITY

This application claims the benefit of U.S. Provisional Application No. 61/835,259, entitled "Pseudo Block Operation Mode in 3D NAND," by Costa, filed on Jun. 14, 2013, incorporated herein by reference.

BACKGROUND

The present disclosure relates to techniques for operating memory cells in a 3D-non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2A depicts a top view of a U-shaped NAND embodiment of a block.

FIG. 3A depicts a close-up view of the region 236 of the column C0 of FIG. 2C, showing a drain-side select gate SGD0 and a memory cell MC303.

FIG. 3B depicts a cross-sectional view of the column C0 of FIG. 3A.

FIG. 4A depicts a top view of a straight NAND string embodiment of the block BLK0 of FIG. 1A.

FIG. 4B depicts a cross-sectional view of the portion 488 of the block 480 of FIG. 4A along line 486.

FIG. 4C depicts an embodiment of a block which includes straight NAND strings.

FIG. 5D is a flowchart of one embodiment of a process of operating a 3D stacked memory device in a pseudo block operation mode.

FIG. 6A is a flowchart of an overview of a pseudo block program and erase operation.

FIG. 6H is a flowchart of one embodiment of a process of performing a pseudo block erase operation.

FIGS. 8A-8C depict voltages in the verify portion of an erase-verify iteration of an erase operation.

FIG. 9A depicts the movement of holes and electrons in a U-shaped NAND string during a two-sided erase.

FIG. 12A shows expected endurance characteristics as a function of memory hole size.

FIG. 12B is a flowchart of one embodiment of a process of a pseudo block endurance mode of operation.

FIG. 12C is a flowchart for one embodiment of a process of pseudo block endurance mode of operation.

DETAILED DESCRIPTION

Figure 1A:
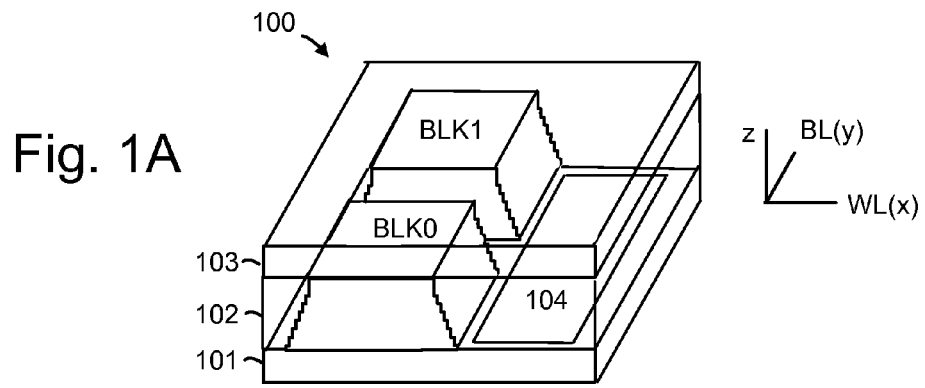
FIG. 1A is a perspective view of a 3D stacked non-volatile memory device.

Techniques are provided for operating storage elements in a 3D stacked non-volatile memory device. The memory device is operated in a pseudo block operation mode in embodiments. The device includes vertically oriented NAND strings, in embodiments. A given NAND string is a part of multiple different pseudo blocks, in accordance with embodiments. Given that the NAND strings may be vertically oriented in different layers of the 3D stacked memory device, this results in the pseudo block assignment being based on which layer a storage element is in. A pseudo block typically contains (parts of) multiple NAND strings.

In some 3D stacked non-volatile memory devices the storage elements are formed in "memory holes" that are drilled in the stacked structure. The diameter of a memory hole may be narrower at the lower layers, for at least some fabrication techniques. This narrowing of the memory holes can have an impact on a variety of performance factors. In one embodiment, the pseudo blocks are assigned based on the size of the memory holes. However, note that even if the memory holes at different layers have the same size, pseudo block operation can still be used, for at least some operations.

Various operations are possible in a pseudo block operation mode. Those operations include, but are not limited to, pseudo block program and erase operation, pseudo block read disturb operation, pseudo block endurance operation, and pseudo block boosting voltage ($V_{PASS}$) operation.

As noted, a given NAND string may reside in different pseudo blocks. In one embodiment, storage elements on a NAND string in a given pseudo block are erased together. However, storage elements on that NAND string that are in other pseudo blocks are not erased at that time. If those other storage elements are currently in a programmed state, they remain in the programmed state when the other portion of the NAND string is erased. In other words, storage elements in one pseudo block are erased while storage element in other pseudo blocks may remain programmed.

One benefit of such an operation is that the size of the unit that is erased/programmed can be more convenient for operation of the memory device, as compared to erasing/programming units that are based on entire NAND strings. For example, the pseudo blocks permit smaller units to be erased/programmed, which increases the flexibility from the perspective of system applications.

Another benefit of such an operation is that different program parameters and/or different erase parameters can be used for different pseudo blocks. For example, pseudo blocks at different levels of the 3D stacked memory device can have different program and/or erase conditions. This can reduce erase time. This can also reduce the maximum erase voltage, which can reduce stress on the storage elements. The stress reduction can improve storage element reliability and improve data retention.

It is possible for read disturb to have a different impact on storage elements at different levels of the 3D stacked memory device. As one possibility, storage elements that were formed in smaller memory holes could suffer more severe read disturb, compared to those formed in larger memory holes. In one embodiment of pseudo block read disturb operation, a metric that describes total read time of storage elements is kept for each pseudo block. This metric could simply be the number of times the pseudo block was read. When the metric reaches a threshold, the pseudo block could be re-programmed, marked as bad, etc. Pseudo blocks at different levels of the 3D stacked memory device can be allotted different maximum allowed reads. This allows the impact of read disturb to be minimized without relaxing the read disturb specification for all storage elements.

It is possible for endurance of storage elements at different levels of the 3D stacked memory device to be different. Endurance here is referring to the number of erase/program cycles. One possible explanation for this is that endurance may be a function of memory hole size, which as noted, may itself be a function of the layer. For some devices, storage elements that were formed in a smaller memory hole have better endurance. In one embodiment of pseudo block endurance operation, the number of erase/program cycles is kept for each pseudo block. A pseudo block may be marked as failed when a maximum allowed number of erase/program cycles is reached. Pseudo blocks at different levels of the 3D stacked memory device may have different endurance thresholds. This allows the impact of storage elements having different endurance to be minimized without relaxing the endurance specification for all storage elements.

For some programming operations, the channel potentials of unselected NAND strings are boosted to prevent program disturb. This can involve applying a boosting voltage to the control gate of unselected storage elements. The ability of the boosting voltage to boost the channel potential may be a function of the layer of the 3D stacked memory device. For some devices, the boosting ability is worse if the size of the memory hole is larger. On the other hand, boosting voltage disturb can be worse for smaller memory holes. In one embodiment, the magnitude of a boosting voltage depends on the pseudo block. For example, pseudo blocks at lower layers (and having smaller memory holes) may have a lower boosting voltage.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
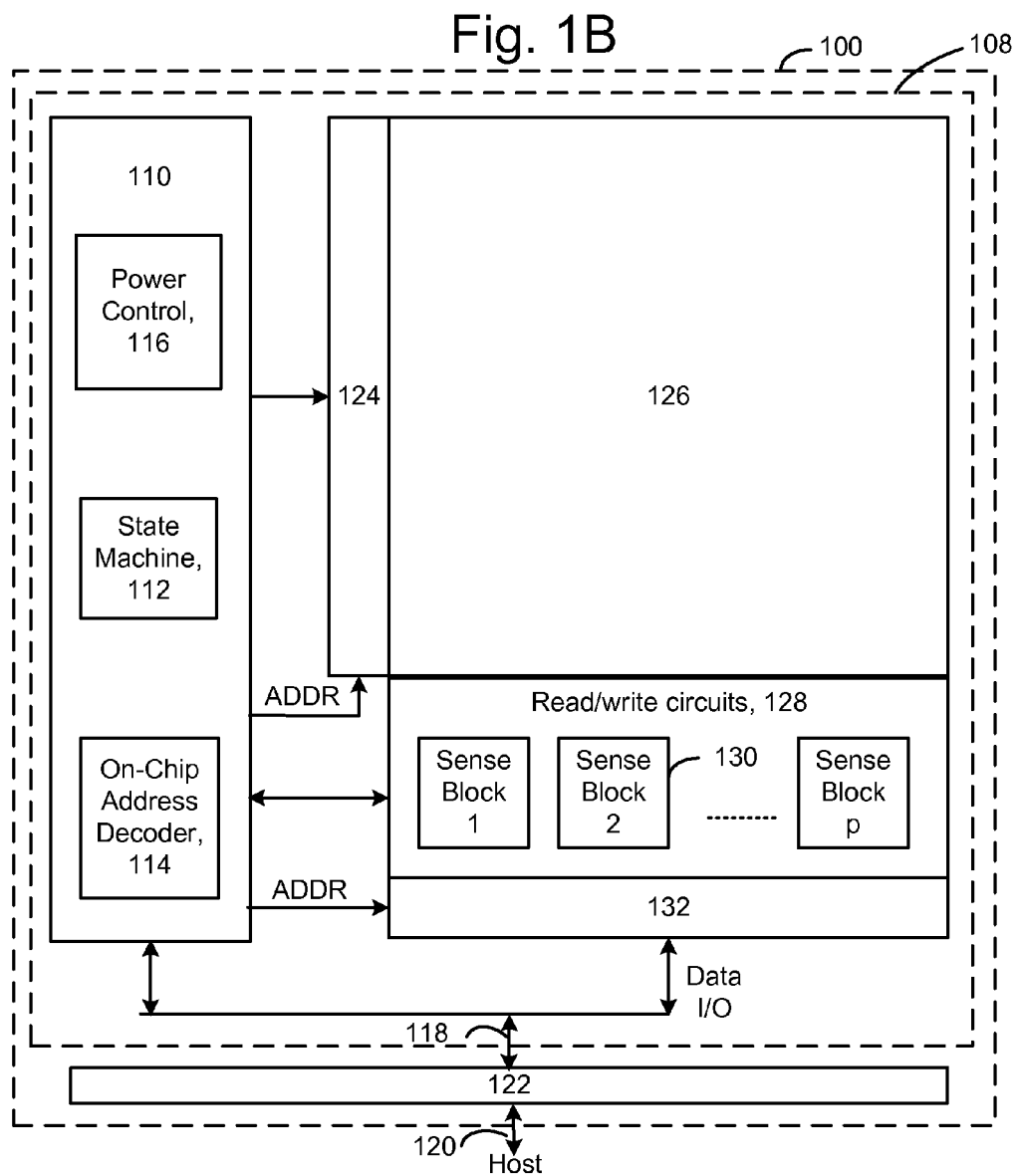
FIG. 1B is a functional block diagram of the 3D stacked non-volatile memory device of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array 126 of storage elements, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half.

Other types of non-volatile memory in addition to NAND flash memory can also be used.

Figure 2B:
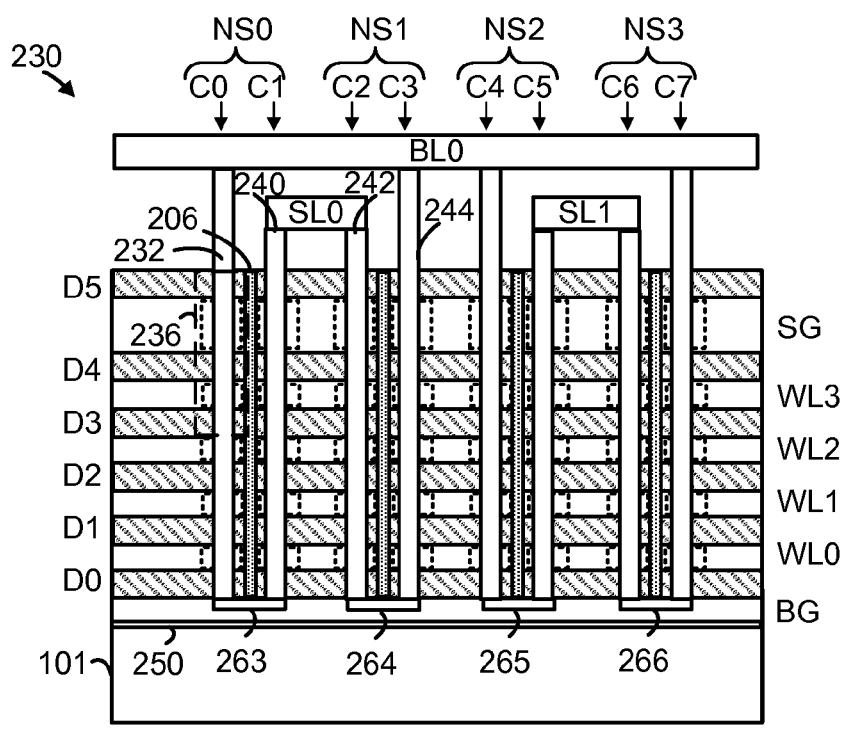
FIG. 2B depicts a cross-sectional view of the portion 210 of the block 200 of FIG. 2A, along line 220.

FIG. 2A depicts a top view of a U-shaped NAND embodiment of a block 200, as an example implementation of BLK0 in FIG. 1A. The view is of a representative layer among the multiple word line layers in a stack. Referring also to FIG. 2B, the stack includes alternating insulating (e.g., dielectric) and conductive layers. The dielectric layers include D0 to D5 and may be made of $SiO_2$, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon, metal silicide, or metal, for instance. An example voltage of 5-10 V may be applied to the back gate to maintain a conductive state which connects the drain- and source-side columns.

For each block, the word line layer is divided into two word line layer portions 202 and 204. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into 5b, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

The drawings are not to scale and do not show all memory columns. For example, a more realistic block might have 12 memory columns in the y direction as shown, but a very large number such as 32k memory columns in the x direction, for a total of 384k memory columns in a block. With U-shaped NAND strings, 192k NAND strings are provided in this example. With straight NAND strings, 384k NAND strings are provided in this example. Assume there are four memory cells per column, so there are 384k×4=1,536k or 1,536,000 total cells in the set.

A portion 210 of the block 200 is described further below in connection with FIG. 3A.

FIG. 2B depicts a cross-sectional view of the portion 210 of the block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 3A.

Figure 2C:
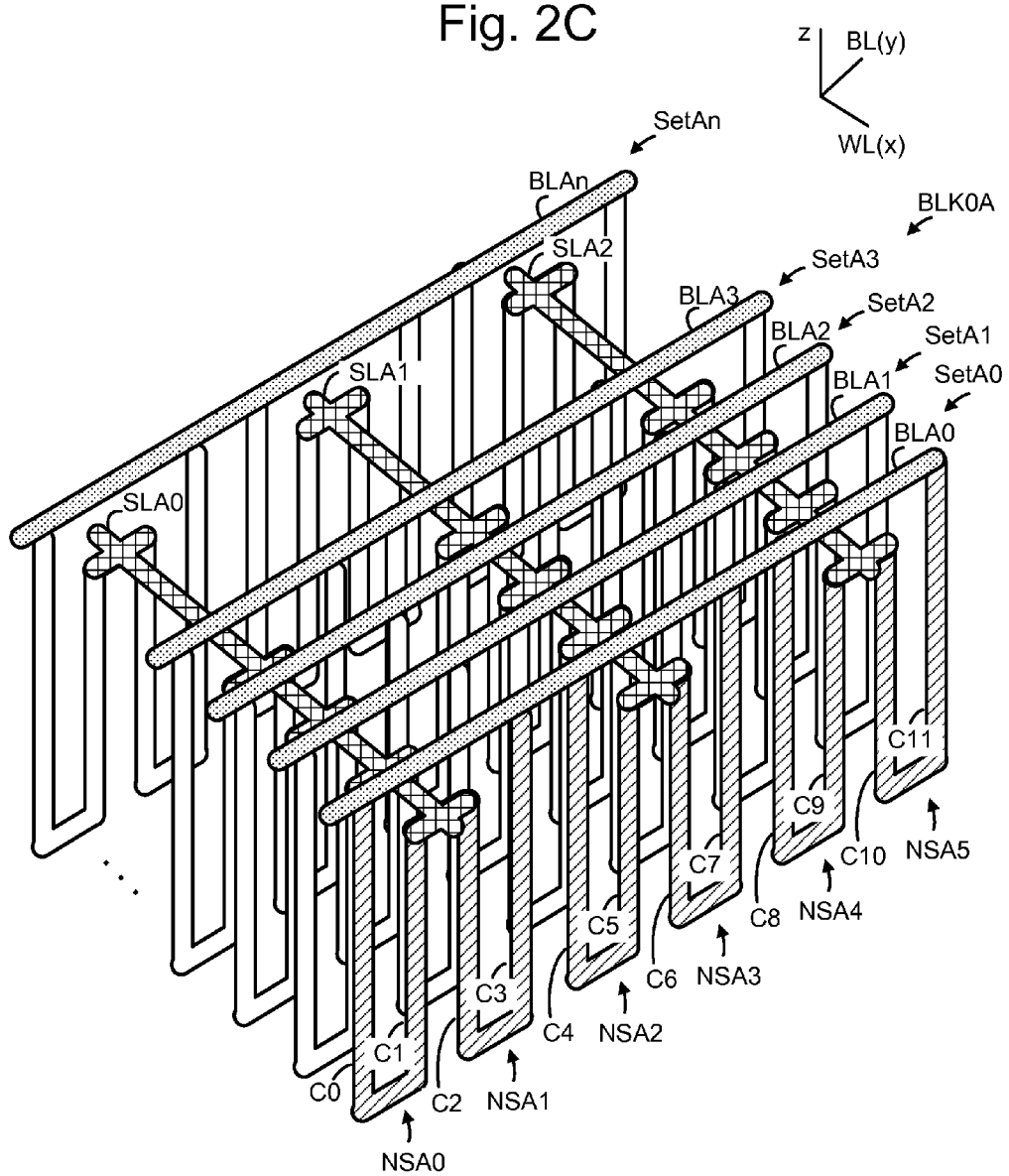
FIG. 2C depicts an embodiment of a block that includes U-shaped NAND strings.

FIG. 2C depicts an embodiment of a block that includes U-shaped NAND strings. The block includes U-shaped NAND strings arranged in sets (SetA0, SetA1, SetA2, SetA3, . . . , SetAn, where there are n−1 sets in a block). Each set of NAND strings is associated with one bit line (BLA0, BLA1, BLA2, BLA3, . . . , BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example. In FIG. 2C there are six NAND strings; however, there could be more or fewer NAND strings in a block.

FIG. 3A depicts a close-up view of the region 236 of the column C0 of FIG. 2B, showing a drain-side select gate transistor SGD0 and a memory cell MC303. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide (BOX) can be deposited as layer 296, a nitride such as SiN as a charge trapping layer (CTL) can be deposited as layer 297, a tunnel oxide (TNL) can be deposited as layer 298, a polysilicon body or channel (CH) can be deposited as layer 299, and a core filler dielectric can be deposited as region 300. Additional memory cells are similarly formed throughout the columns.

When a memory cell is programmed, electrons are stored in a portion of the CTL which is associated with the memory cell. For example, electrons are represented by "−" symbols in the CTL 297 for MC303. These electrons are drawn into the CTL from the channel, and through the TNL. The threshold voltage of a memory cell is increased in proportion to the amount of stored charge.

During an erase operation, as discussed further below, a voltage in the channel is raised due to gate-induced drain leakage (GIDL). The voltage of the one or more selected word line layers is then driven down to a reduced level such as 0 V to create an electric field across the TNL which causes holes to be injected from the memory cell's body to the CTL, resulting in a large VTH downshift toward an erase-verify level, Vv_erase. This process can be repeated in successive iterations until a verify condition is met, as discussed further below. For unselected word lines, the word lines remain at an elevated level so that the electric field across the TNL is relatively small, and no, or very little, hole tunneling will occur. Memory cells of the unselected word lines will experience little or no VTH downshift, and as a result, they will not be erased.

FIG. 3B depicts a cross-sectional view of the column C0 of FIG. 3A. Each layer is ring-shaped in one possible approach, except the core filler, which is cylindrical.

FIG. 4A depicts a top view of a straight NAND string embodiment 480 of the block BLK0 of FIG. 1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4B.

FIG. 4B depicts a cross-sectional view of the portion 488 of the block 480 of FIG. 4A along line 486. Columns of memory cells corresponding to NAND strings NS8 to NS11 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit line BL0A is also depicted. Dashed lines depict memory cells and select gate transistors. The erase techniques described herein can be used with a U-shaped or straight NAND.

FIG. 4C depicts an embodiment of a block which includes straight NAND strings. The block includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 5A:
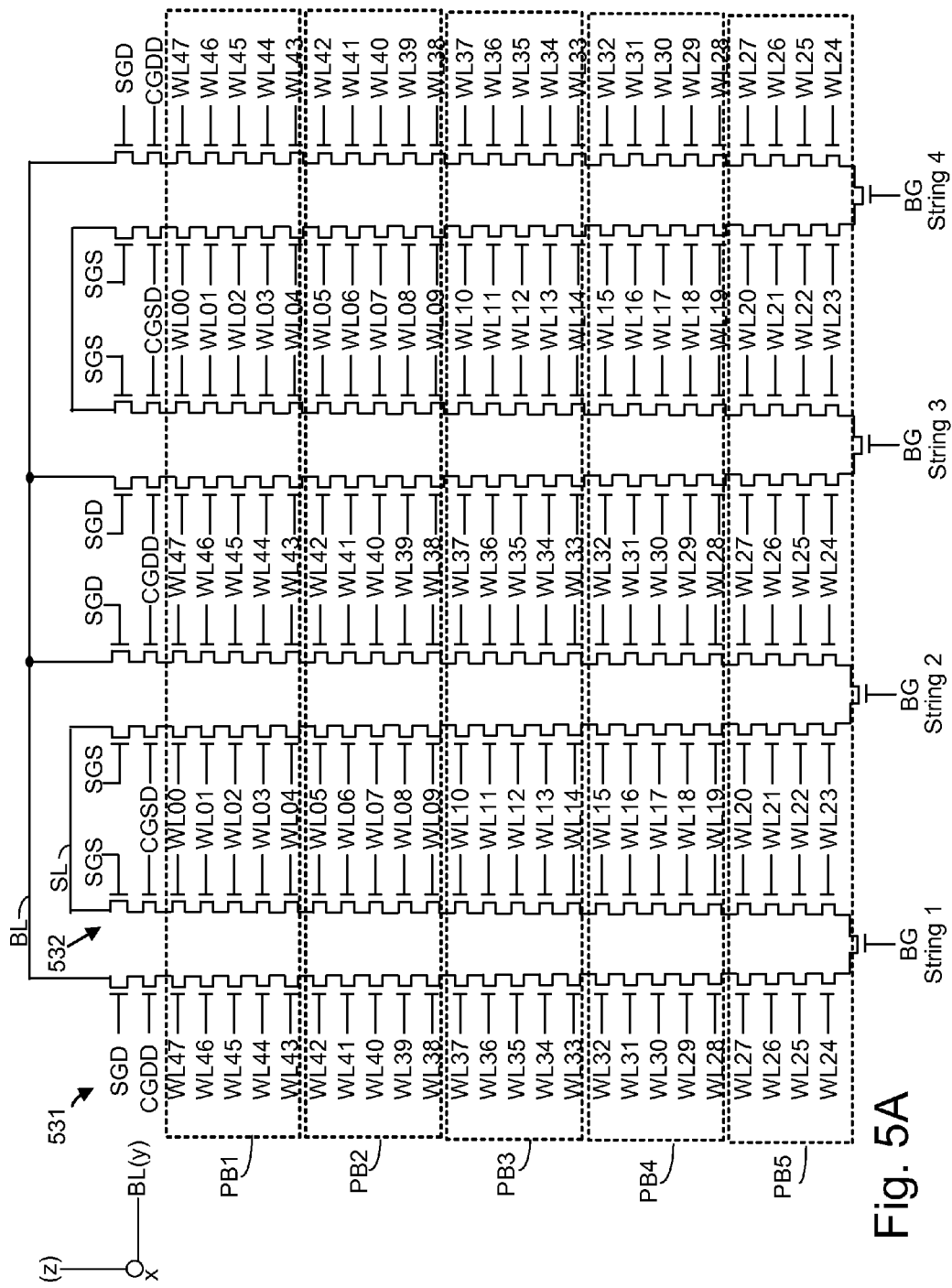
FIG. 5A depicts an example assignment of storage elements to pseudo-blocks for U-shaped NAND strings.

FIG. 5A depicts an example assignment of storage elements to pseudo-blocks. This example is for U-shaped NAND strings. Four NAND strings are shown in this example. Each NAND string has a drain side 531 which extends between a bit line (BL) and a back gate (BG) and a source side 532 which extends between a source line (SL) and the BG. The drain side includes an SGD transistor, a dummy transistor (CGDD) and storage elements that are connected to word lines (WL24-WL47). The source side includes an SGS transistor, a dummy transistor (CGSD) and storage elements that are connected to word lines (WL00-WL23).

One or more dummy transistors on each side can be used to avoid disturbs. One or more dummy transistors can optionally be provided between groups as well.

Five pseudo blocks (PB1-PB5) are represented in FIG. 5A. Pseudo block 1 (PB1) includes storage elements associated with word lines WL00-WL04, as well as storage elements associated with word lines WL43-WL47. Pseudo block 2 (PB2) includes storage elements associated with word lines WL05-WL09, as well as storage elements associated with word lines WL38-WL42. Pseudo block 3 (PB3) includes storage elements associated with word lines WL10-WL14, as well as storage elements associated with word lines WL33-WL37. Pseudo block 4 (PB4) includes storage elements associated with word lines WL15-WL19, as well as storage elements associated with word lines WL28-WL32. Pseudo block 5 (PB5) includes storage elements associated with word lines WL20-WL23, as well as storage elements associated with word lines WL24-WL27.

In this example, there are five pseudo blocks, but there could be more or fewer. In this example, most of the pseudo blocks are the same size, although one is smaller. That is, PB1-PB4 each occupy five memory cell layers, whereas PB5 occupies four memory cell layers. All of the pseudo blocks could be the same size. All of the pseudo blocks could be different sizes. There is no limit to the possibilities in how many pseudo blocks are used and their sizes. However, note that having pseudo blocks that are about the same size is possibly a benefit from the perspective of simplifying system performance.

Note that FIG. 5A depicts the yz plane, but does not depict how the pseudo blocks extend in the x-direction. Referring back to FIG. 2C, recall that a block may contain many NAND strings extending in the x-direction also. For example, NSA0 and many other NAND strings are associated with source line SLA0. Just as a block extends in the x-direction, a pseudo block may extend in the x-direction.

The four depicted NAND strings in FIG. 5A roughly correspond to NSA0-NSA3 in FIG. 2C. Thus, it will be understood that each pseudo block may contain additional NAND strings in the x-direction that are not depicted in FIG. 5A.

Referring back to FIG. 2A, a top view of a U-shaped NAND embodiment of a block 200 is depicted. In effect, this represents one layer of a block. This, in effect, also represents one layer of a pseudo block. A pseudo block may have multiple such layers, as shown in FIG. 5A. Thus, it will be appreciated that the pseudo blocks also extend in the x-direction, although this is not depicted in FIG. 5A.

Figure 5B:
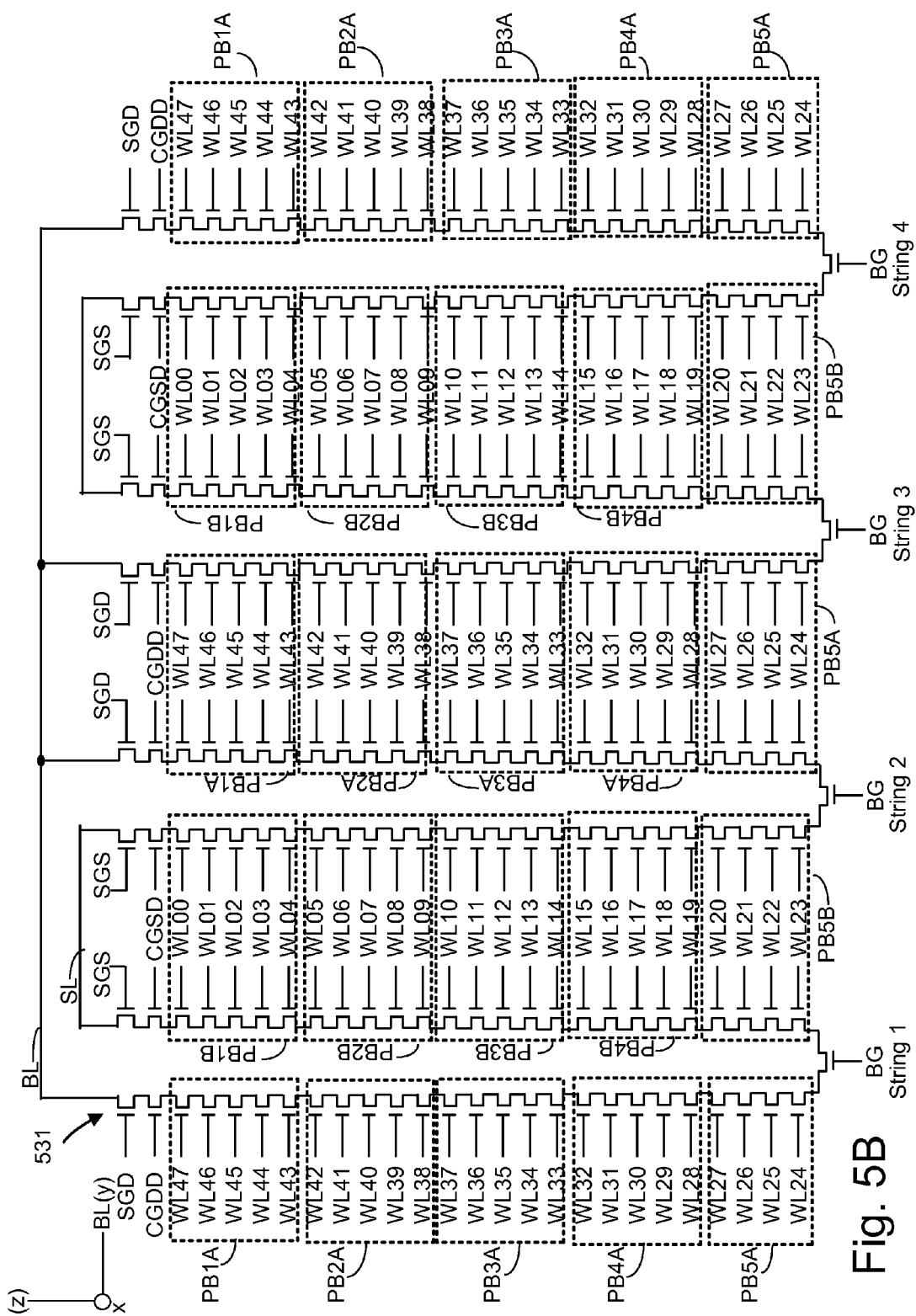
FIG. 5B depicts another example assignment of storage elements to pseudo-blocks along U-shaped NAND strings.

FIG. 5B depicts another example assignment of storage elements to pseudo-blocks along a string. The U-shaped NAND strings are similar to the example of FIG. 5A.

Ten pseudo blocks (PB1A, PB1B, PB5B) are represented in FIG. 5B. Pseudo block 1A (PB1A) includes storage elements associated with word lines WL43-WL47. Pseudo block 1B (PB1B) includes storage elements associated with word lines WL00-WL04. Pseudo block 2A (PB2A) includes storage elements associated with word lines WL38-WL42. Pseudo block 2B (PB2B) includes storage elements associated with word lines WL05-WL09. Pseudo block 3A (PB3A) includes storage elements associated with word lines WL33-WL37. Pseudo block 3B (PB3B) includes storage elements associated with word lines WL10-WL14. Pseudo block 4A (PB4A) includes storage elements associated with word lines WL28-WL32. Pseudo block 4B (PB4B) includes storage elements associated with word lines WL15-WL19. Pseudo block 5A (PB5A) includes storage elements associated with word lines WL24-WL27. Pseudo block 5B (PB5B) includes storage elements associated with word lines WL20-WL23.

Note that FIG. 5B depicts the yz plane, but does not depict how the pseudo blocks extend in the x-direction. The pseudo blocks may extend in the x-direction, as discussed with respect to FIG. 5A. Also note that each pseudo block in FIG. 5B that is labeled with the same reference is part of the same pseudo block. For example, the several regions labeled "PB1A" are all part of the same pseudo block. This can be understood by examining the two portions 202, 204 of the block depicted in FIG. 2A.

Figure 5C:
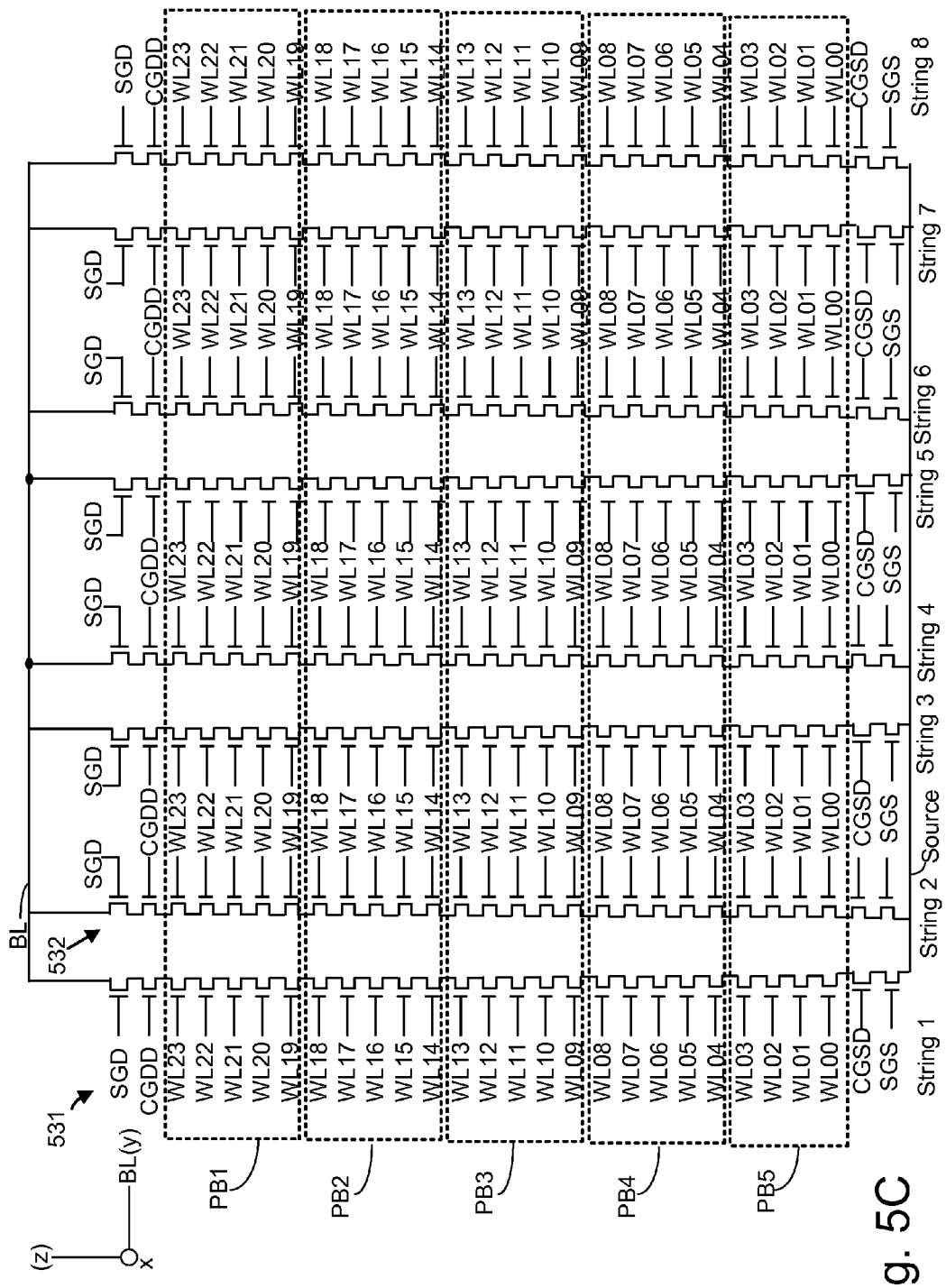
FIG. 5C is one example of how straight NAND strings in a 3D stacked memory device can be divided into pseudo blocks.

Straight NAND strings, such as depicted in FIGS. 4A-4C may also be divided into pseudo blocks. FIG. 5C is one example of how straight NAND strings in a 3D stacked memory device can be divided into pseudo blocks. FIG. 5C shows eight straight NAND stings. Each NAND string is associated with word lines WL00-WL23. In this example, there are five pseudo blocks (PB1-PB5). There could be more or fewer pseudo blocks. As with the example of FIG. 5C, the pseudo blocks may extend in the x-direction.

FIG. 5D is a flowchart of one embodiment of a process of operating a 3D stacked memory device in a pseudo block operation mode. The process could be applied to devices having U-shaped NAND strings or straight NAND strings, but is not limited to the example 3D memory devices provided herein.

Step 502 assigns storage elements in a NAND string to pseudo blocks. FIG. 5A-5C show a few examples, but step 502 is not limited to those examples. Each NAND string comprises a channel and extends vertically through layers of the 3D stacked non-volatile memory device, in embodiments. The block is divided into pseudo blocks that each comprise a portion of the NAND string. The portion of the NAND string may include multiple contiguous storage elements. Each NAND string may be a member of each of the pseudo blocks.

That is, some storage elements on the NAND string belong to a first pseudo block, other storage elements to a second pseudo block, etc. In one embodiment, the pseudo blocks are assigned based on location along the NAND string. A state machine or other circuit can store the group assignment information. Techniques are described below for how to determine the mapping of storage elements to pseudo blocks.

In step 504, control logic operates the 3D NAND in pseudo block operation mode. In one embodiment, a control circuit performs operations on a pseudo block level. Performing an operation on a pseudo block level means that either the operation is performed on that pseudo block and not on other pseudo blocks in the block or the operation is somehow dependent on the pseudo block in which it is performed. Thus, in one embodiment, performing an operation on a pseudo block level includes performing the operation (e.g., erase, program) on that pseudo block but not on other pseudo blocks in the block. Performing operations on a pseudo block level includes performing operations (e.g., applying starting erase voltage, applying boosting voltage, checking a read disturb parameter, checking an endurance parameter) in a way that depends on which pseudo block the operation is performed in, for one embodiment. Examples of pseudo block operations include, but are not limited to, pseudo block program and erase operation, pseudo block read disturb operation, pseudo block endurance operation, and pseudo block boosting voltage (Vpass) operation. Pseudo block operation mode is not limited to these examples.

Pseudo Block Program and Erase Operation

In 2D NAND memory devices, the p-well substrate is biased at a high voltage to erase the storage elements (memory cells). Note that the NAND strings are typically formed in the substrate, such that by applying the erase voltage to the substrate while, for example, grounding the control gates, the memory cells can be erased. In contrast, the NAND strings in a 3D stacked non-volatile memory device such as BiCS are not formed in a substrate (see, for example, FIG. 2B or 4B).

One approach to erasing in a 3D stacked non-volatile memory device is to generate gate induced drain leakage (GIDL) current to charge up the channel, raise the channel potential to an erase voltage, and maintain this channel potential during erase. Therefore, the erase speed is affected by channel charging up time and erase performance is impacted by interactions between channel potential, tunneling speed, and GIDL current. Further, the tunneling speed is also affected by variations in the diameter of the memory hole. The erase process thus has a layer dependent pattern.

The erase speed and depth can vary along a string due to factors such as variations in a potential drop in the channel relative to a driven end of a string of storage elements and variations in the diameter of the memory hole. A potential drop occurs when holes are diverted from the channel and tunnel through a tunneling layer to a charge trapping layer of the storage elements. The holes recombine with electrons there to reduce the charge in the charge trapping layer, thereby erasing the storage elements.

Storage elements which are further from the driven end, e.g., the drain side or source side of a NAND string, will experience a larger potential drop which slows their erase speed. Regarding the memory hole, its diameter can vary due to process variations. In some cases, the memory hole is vertical and tapered, becoming smaller at the bottom. A smaller diameter results in a stronger field and a faster erase speed.

FIG. 6A is a flowchart of an overview of a pseudo block program and erase operation. This is one embodiment, of operating a 3D NAND in a pseudo block operation mode (step 504 of FIG. 5D). In step 602, a command is received to program data into a given pseudo block. This program command may be preceded by or accompanied by a command to erase the pseudo block. Note that the erasing can be performed well prior to the programming.

In step 604, the pseudo block is erased while not erasing other pseudo blocks in the block. This includes erasing a part of a NAND string, while not erasing other parts of the NAND string, in one embodiment. Note that other pseudo blocks in the block may remain programmed after the erase of the pseudo block is competed. In one embodiment, the entire pseudo block is erased prior to programming. FIG. 6E provides further details for one embodiment of erasing a pseudo block.

Figure 10A:
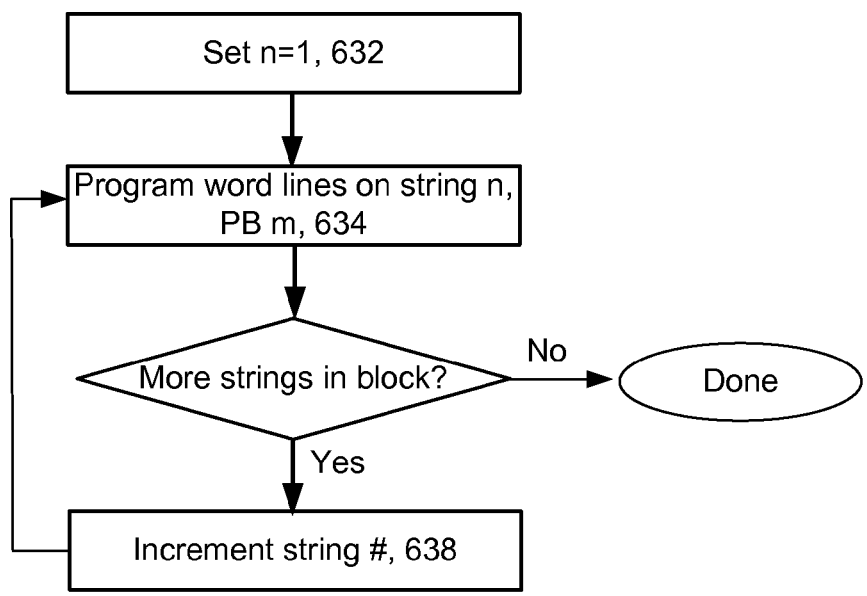
FIG. 10A depicts one embodiment of programming a pseudo block in pseudo block mode.

In step 606, the pseudo block is programmed. As noted, the programming can occur well after the erasing. Also, it is not required that the entire pseudo block be programmed at the same time. FIG. 10A provides further details for one embodiment of programming a pseudo block.

Figure 6B:
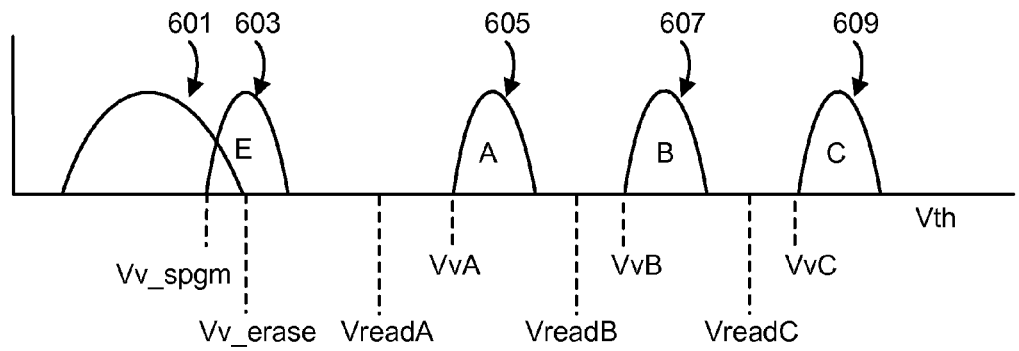
FIGS. 6B-6D show further details of erasing and programming
Figure 6C:
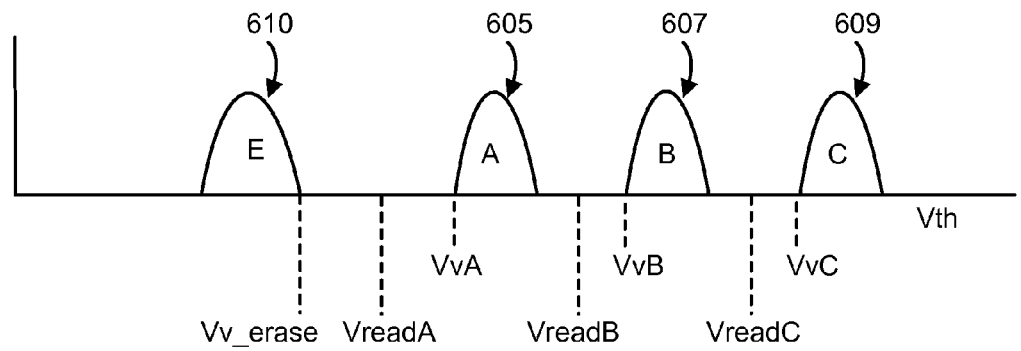
Figure 6D:
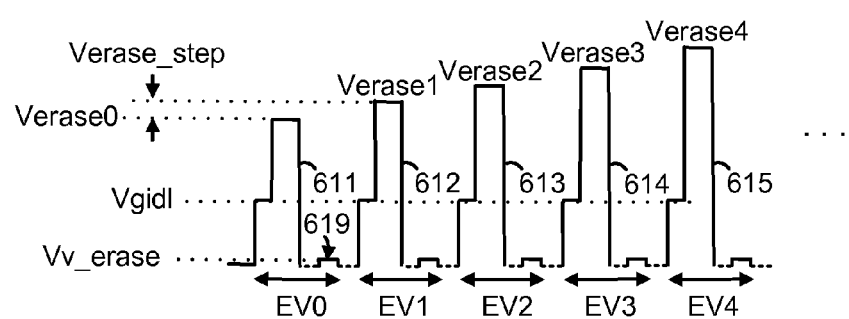
Figure 6E:
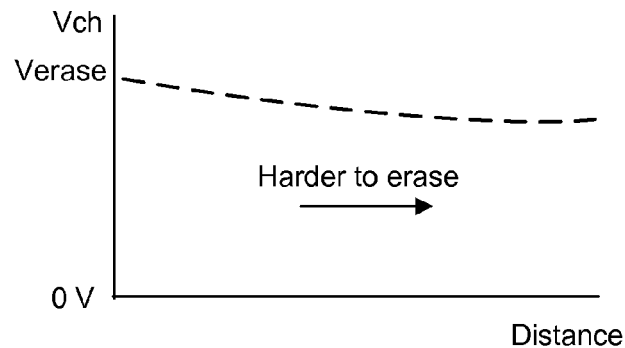
FIG. 6E depicts a local potential drop in a channel of a string in an erase operation based on a distance from a driven end of the string.

FIGS. 6B-6D show further details of erasing and programming FIGS. 6B and 6C show example threshold distributions after erase and program. FIG. 6B depicts threshold voltage distributions of a deep erased state, a final erased state and higher data states of one example erase operation. Storage elements can be programmed so that their threshold voltages are in respective ranges which represent data states. Initially, an erase operation is performed which places all of the storage elements in the erased state (E). Subsequently, some of the storage elements can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial (deep) erased state distribution 601, a soft programmed erased state (E) distribution 603, an A state distribution 605, a B state distribution 607 and a C state distribution 609. Memory devices with additional data states, e.g., eight or sixteen data states, can also be used. The distribution 601 is realized after the erase operation when storage elements are typically over-erased, past the erase state distribution 603. In the erase operation, one or more erase pulses are applied to the NAND string at its source and/or drain ends, until the threshold voltage of the storage elements being erased transitions below an erase-verify level, Vv_erase which can be 0 V or close to 0 V, in one approach. Once the erase operation is completed for a pseudo block, the soft programming operation can be optionally performed, in which one or more positive voltage pulses are applied to the control gates of the storage elements, such as via a word line, to increase the threshold voltages of some or all of the storage elements in the distribution 601 above a soft programming (SPGM) verify level, Vv_spgm, to the erased state distribution 603. This avoids a deep erased state.

The soft programming operation advantageously results in a narrow erase state distribution 603. Once the soft programming operation is complete, programming to higher data states can occur, such as to states A, B and C using verify levels VvA, VvB and VvC, respectively. A subsequent read operation can use the levels VreadA, VreadB and VreadC.

FIG. 6C depicts threshold voltage distributions of a soft erased state and higher data states of another example erase operation. In this approach, the erase state distribution 610 is reached after a soft erase. In one option, no soft programming is performed. Vv_erase can be the same or different in FIGS. 6B and 6C.

FIG. 6D depicts a series of erase pulses and verify pulses in an erase operation, where Verase is stepped up in successive erase-verify iterations. A waveform 620 represents a number of erase-verify iterations EV0, EV1, EV2, . . . . Each erase-verify iteration includes an erase pulse 611-615 (erase portion) followed by a verify pulse such as 619 of magnitude Vv_erase (erase-verify portion). The erase pulses have two levels. A first level is Vgid1 and a second level is Verase. In this example, Verase is stepped up in each iteration by a step size Verase_step so that erase pulse 611 has a peak amplitude of Verase0, erase pulse 612 has a peak amplitude of Verase1, erase pulse 613 has a peak amplitude of Verase2, erase pulse 614 has a peak amplitude of Verase3, and erase pulse 615 has a peak amplitude of Verase max, a maximum allowed level of Verase. In this case, the maximum erase voltage is reached relatively soon in the erase operation. Vgid1 can be fixed in each erase pulse or varying, such as by stepping up with each erase pulse.

FIG. 6E depicts a local potential drop in a channel of a string in an erase operation based on a distance from a driven end of the string. The channel potential can decrease further from a driven end during an erase operation. The x-axis depicts a distance from a driven end and the y-axis depicts the channel voltage, Vch, relative to Verase. For two-sided erase, the storage elements associated with WL24 and WL23 in FIG. 5A are furthest from the bit line and source line, respectively. For one-sided erase, the storage element associated with WL00 in FIG. 5B is furthest from the bit line. As mentioned, a larger potential drop makes it harder to erase the storage elements.

Figure 6F:
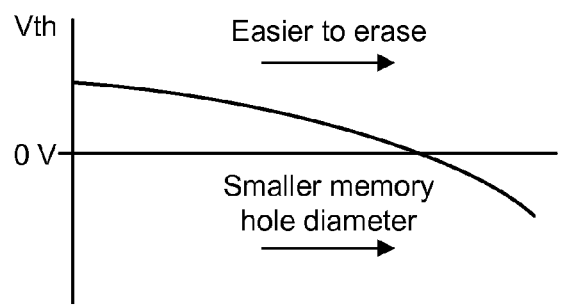
FIG. 6F depicts variations in an erase depth along a string based on variations in memory hole diameter along the string.

However, another factor in erase speed is the memory hole diameter. FIG. 6F depicts variations in an erase depth along a string based on variations in memory hole diameter along the string. As mentioned, it is easier to erase a storage element which is at a part of the memory hole which has a smaller diameter. The x-axis depicts a memory hole diameter and the y-axis depicts a threshold voltage Vth level of the storage elements. The Vth level indicates an erase depth such that a lower Vth indicates a deeper erase or an easier to erase storage element. This data was obtained by applying an erase pulse of fixed amplitude and duration to each storage element and measuring the resulting Vth of the storage element.

Figure 6G:
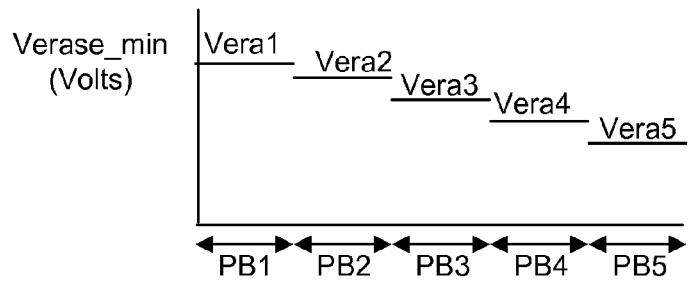
FIG. 6G depicts example starting erase voltages for different pseudo blocks.

FIG. 6G depicts example starting erase voltages for different pseudo blocks. For some devices, storage elements that have smaller memory holes will erase faster relative to those with larger memory holes. The starting erase voltage may be smaller for storage elements having smaller memory holes to take advantage of this. In some devices, the memory holes are smaller at lower layers. This leads to using a smaller starting erase voltages for pseudo blocks that are at lower layers, in one embodiment.

In the example of FIG. 6G, five pseudo blocks PB1-PB5 are depicted. The x-axis depicts a pseudo block number and the y-axis depicts an initial erase voltage (Verase_min). Five levels, Vera1-Vera5, are depicted.

In one approach, the levels of Verase_min are a function layer of the 3D stacked memory. Note that the memory hole size decreases at the lower layers of some 3D stacked memory device, for at least some fabrication techniques. Thus, the levels of Verase_min are a function of memory hole size, in one approach. In one approach, the levels of Verase are a function of distance from a driven end of a NAND string although other variations are possible. An optimal assignment of Verase_min level for a group can be determined from tests.

A reasonable approximation is to have Verase_min be smaller for smaller memory holes, and larger for larger memory holes. Another factor in Verase_min may, optionally, be the distance of the pseudo block from where the erase voltage is applied. The value for Verase_min may be different for a one-sided erase than for a two sided erase.

FIG. 6H is a flowchart of one embodiment of a process of performing a pseudo block erase operation. This is one embodiment of erasing a pseudo block while not erasing other pseudo blocks (step 604 of FIG. 6A). The process will describe erasing storage elements of a selected NAND string that are in the pseudo block that is selected for erase. For example, referring to FIG. 5A, the selected NAND string may be string 1 and the selected pseudo block may be PB1. Referring to FIG. 5B, the selected NAND string may be string 1 and the selected pseudo block may be PB1A. Note that in this case only the drain side of the NAND string is being erased. As one alternative, the selected NAND string may be string 1 and the selected pseudo block may be PB1B. In this case, the source side of the NAND string is being erased. The process may also be applied to straight NAND strings. Referring to FIG. 5C, the selected NAND string may be string 1 and the selected pseudo block may be PB1. Note that (portions of) many NAND strings could be erased at the same time. As one example, referring back to FIG. 2C, the pseudo block could include (portions of) a set of NAND strings in the x-direction. A "portion of" of NAND string is being referred to because typically a pseudo block is a few layers of the 3D memory device, as shown in FIG. 5A, for example.

Portions of other NAND strings in the selected pseudo block could also be selected for erase. For example, referring to FIG. 5A, some of the storage elements associated with NAND strings 2-4 may be unselected or selected, as desired. Also, portions of other NAND strings in the x-direction could be selected for erase. For example, referring to FIG. 2C, portions of NAND strings associated with source line SLA0 could be selected for erase. The portions being referred to could be portions associated with word lines WL00-WL04 and WL43-WL47. Thus, the erase process of FIG. 6E can be applied to more than one NAND string in a pseudo block. For purpose of discussion, an example of erasing a portion of one NAND string will be discussed.

Generally, an erase operation can include multiple erase-verify iterations which are performed until a verify condition is met, at which point the erase operation ends (see FIG. 6D). In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Step 616 sets status=erase for the storage elements on the selected NAND string that are in the selected pseudo block. For example, referring to FIG. 5A, storage elements in NAND string 1 that are associated with word lines WL00-WL04 and WL43-WL47 are selected for erase. As noted, the portions of other NAND strings that are in the selected pseudo block may (but are not required to) have their status set to erase.

Step 618 sets status=inhibit for the storage elements in the unselected pseudo blocks. For example, pseudo blocks PB2-PB5 (see FIG. 5A) are unselected for erase. Note this also applies to storage elements on the selected NAND string that are not in the selected pseudo block. For example, referring to FIG. 5A, storage elements in NAND string 1 that associated with word lines WL05-WL42 have their status set to inhibit.

Step 621 initializes an erase voltage (Verase) to a starting value. This starting value depends on which pseudo block is being erased, in one embodiment. FIG. 6G depicts one example of how Verase_min might decrease in magnitude for pseudo blocks having smaller memory holes.

Step 622 charges the channel of the string by applying the erase voltage to the string, setting a control gate voltage for each storage element with status=erase to encourage erasing, and floating or setting a control gate voltage for each storage element with status=inhibit to discourage erasing. For example, a control gate voltage at a relatively high level (e.g., 10-15 V) discourages erasing by creating a small potential difference across the tunneling layer.

A control gate voltage at or slightly above, for example, 0 V encourages erasing by creating a large potential difference across the tunneling layer, between the channel and the control gate, which encourages further tunneling. See, e.g., FIGS. 7C and 8C for further details.

Step 623 performs an erase-verify test for storage elements in the selected pseudo block (for the selected NAND string). The erase-verify test can be performed concurrently for the different storage elements on the string in the pseudo block. For example, this can involve applying a common erase-verify control gate voltage (Vv_erase) to the control gate of each storage element in the selected pseudo block while detecting the current through the string.

Note that storage elements on the selected NAND string that are in other (unselected) pseudo blocks could be in the programmed state or in the erased state. For example, these storage elements could be in any of states E, A, B C, for a four state example (see FIG. 6C). In one embodiment, a suitable voltage is applied to the control gate of those storage elements depending on their state. For example, if the storage element is known to be erased, then the erase-verify control gate voltage (Vv_erase) can be applied. However, if the storage element might be in a programmed state, then another voltage may be applied to the control gate. Note that it is not required to know which of the programmed states that the storage element is in. As one possibility, a voltage is applied of sufficient magnitude to cause the memory cell to turn on regardless of its state. For example, a voltage VREAD could be applied to the control gate. VREAD is a voltage that should cause the storage element to conduct regardless of its threshold voltage (or state).

If the current of the string is above a reference current, indicating the string is conductive, the erase-verify test is passed.

Step 624 sets status=inhibit if the selected NAND string passed the erase-verify test. Note this refers to the portion of the selected NAND string that is in the selected pseudo block. The erase status=erase is continued if the selected NAND string does not pass the erase-verify test.

Decision step 626 determines if Verase is at Verase max. If the answer is "yes," the erase operation ends unsuccessfully at step 627. If the answer is "no," Verase is stepped up at step 628 and another iteration is performed at step 622.

The erase operation of FIG. 6E may be a one-side erase operation or a two-sided erase operation. In an example two-sided erase, pseudo block includes storage elements on the drain and source sides. However, other approaches are possible. The pseudo block may be mostly equal in size although this can vary as well. The pseudo block assignments can be made by grouping storage elements which are expected to have a common erase speed. Typically, a pseudo block will include multiple adjacent storage elements.

In one embodiment of a one-sided erase, the bit line is the driven end. This is a factor in the source side storage elements having a slower erase speed since they are furthest from the driven end. However, the memory hole size may also be a factor in the erase speed.

In the examples of FIGS. 5A and 5B, the strings are U-shaped. The groups extend from one end of the string (e.g., the BL or SL end) to the back gate of the string. The groups also extend from one end of the string (e.g., the BL or SL end) to the opposing end of the string (e.g., the SL or BL end). Optionally, the string is straight and the groups extend from one end of the string (BL or SL end) to an opposing end of the string (SL or BL end).

Figure 7A:
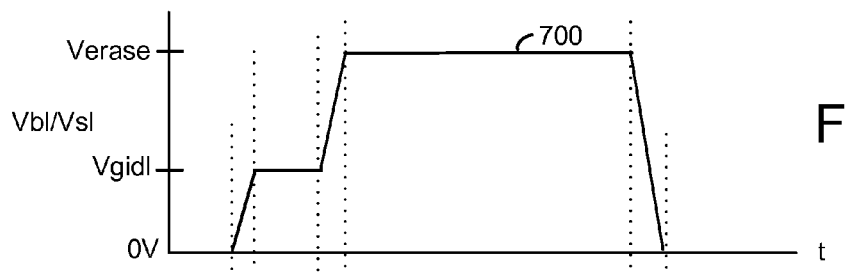
FIG. 7A-7C depicts example voltages during the erase portion of an erase-verify iteration of an erase operation.
Figure 7B:
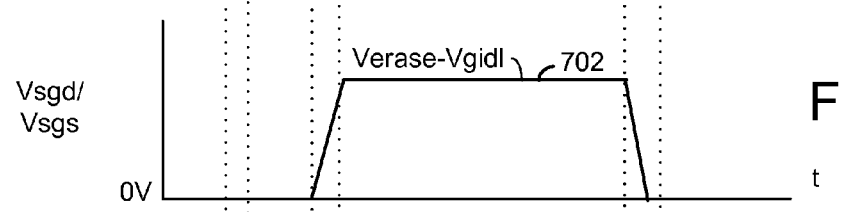
Figure 7C:
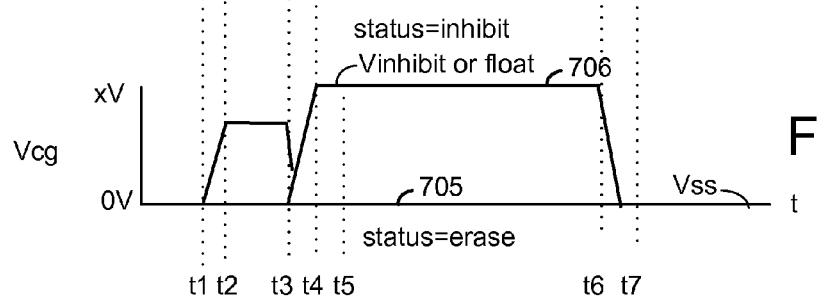

FIG. 7A-7C depicts example voltages during the erase portion of an erase-verify iteration of an erase operation. An erase operation can include multiple erase-verify iterations, e.g., EV0, EV1, EV2, ... such as discussed in connection with FIG. 6D. Each erase-verify iteration can include an erase portion followed by an erase-verify portion. Moreover, each erase portion can have multiple levels. In one approach, a two-level erase portion is used. Further, an erase operation can involve a one-sided or a two-sided erase. A one-sided erase applies a voltage to the drain-end of a NAND string via a bit line to charge up the NAND string, while the source-end of the NAND string is not used to charge up the NAND string. A two-sided erase charges up a NAND string via both the drain-end and the source-end. Two-sided erase is faster than one-sided erase but requires a larger chip size. Generally, the erase portion can include a pre-charge phase (t1-t3) and an erase phase (t3-t6).

FIGS. 7A-7C have a common time axis but the time increments are not necessarily equally spaced and the figures are not necessarily to scale. Moreover, the voltage levels provided are examples only as other values can be used.

FIG. 7A depicts example voltages for a bit line and source line in a two-sided erase. A selected bit line or source line is in communication with one or more NAND strings having storage elements which are to be erased in the current erase iteration. Waveform 700 depicts Vb1 and Vs1 (two-sided erase) initially at 0 V (Vss), then being raised to Vgid1 (a pre-charge voltage) (e.g., 8 V) from t1-t2, then being raised to Verase (e.g., 20 V) from t3-t4, then returning to 0 V from t6-t7. For one-sided erase, Vs1 is raised to a reduced level such as 14 V, for instance, from t5-t6, and provided at 2 V at t2-t3

When Vb1 is at Vgid1, holes are generated at the SGD drain edge so that the channel is charged from the bit line end of the NAND string. Similarly, when Vs1 is at Vgid1, holes are generated at the SGS drain edge so that the channel is also charged from the source line end of the NAND string. Vgid1 is a voltage which is at or above a minimum voltage for creating GIDL. When Vb1 is raised to Verase, charging of the channel continues from the bit line end. Similarly, when Vs1 is raised to Verase, charging of the channel continues from the source line end.

FIG. 7B depicts example voltages for SGD and SGS transistors. From t2-t3, with Vb1 at 8 V and Vsgd and/or Vsgs at 0 V, the junction of the SGD and/or SGS transistor is reversed biased at Vgid1 (the potential difference between Vb1 and/or Vs1 and Vsgd). As a result, electron-hole pairs will be generated near the bit line and/or source line junctions. Electrons will be swept away by the electrical field and collected at the bit line and/or source line terminals; while holes will drift to the channel and help to charge up the channel. That is, the electrons will drift toward a high potential (e.g., at the BL or SL), while the holes will drift toward a low potential. Given a sufficiently long pre-charge time, the channel will be boosted close to Vgid1.

From t4-t6 (waveform 702), Vsgd and/or Vsgs (selected string) is raised to Verase−Vgid1 (e.g., 20−8=12 V). Since Vb1 and/or Vs1 is raised to Verase at this time, the junction of the SGD and/or SGS transistor is still reversed biased at Vgid1 (since Verase−(Verase−Vgid1))=Vgid1. As a result, electron-hole pairs will continue to be generated and the channel will be charged to a higher potential.

For an unselected string, Vsgd and/or Vsgs is raised to Verase−Vrev (e.g., 20−2=18 V). Vrev is a reverse bias such as 2 V which is maintained on the select gate. For one-sided erase of an unselected string, Vsgd is raised to Verase−Vrev (e.g., 20−2=18 V).

FIG. 7C depicts example control gate voltages for uninhibited and inhibited of storage elements. In this example, the control gate voltages are the same for the different groups of uninhibited storage elements which are being erased (and have status=erase) in a given iteration. The control gate voltages can be set to 0 V, for instance, from t4-t6 (waveform 705) to encourage further erasing of the associated storage elements.

For the inhibited groups (status=inhibit), the control gate voltages can be set to an inhibit level (Vinhibit) or floated (waveform 706) to discourage erasing of the associated storage elements. Specifically, for an unselected word line, the control gate can be floated or driven at a higher bias such as 12 V. If the channel potential reaches 20 V during erase, the WL is biased at 12 V. Therefore, the gated junction of a data WL sees 8 V, which is large enough to generate GIDL to help expedite charging up the channel to speed up the erasing of the remaining groups of storage elements with status=erase. During the pre-charge step, an unselected WL can be biased at Vgid1, which is the same as Vb1.

The control gate voltages from t2-t3 are configured at a level which discourages erase of the associated storage elements, while the control gate voltages from t3-t6 are configured at a level which encourages erase of the associated storage elements. To discourage erase of a storage element, the control gate voltage should be sufficiently high to discourage tunneling of holes into a charge trapping layer of the storage element. To encourage erase of a storage element, the channel voltage should be sufficiently higher than the control gate voltage to encourage tunneling.

In either case, the control gate voltages can be at a level which encourages charging of the channel through GIDL throughout the erase operation. For example, the control gate voltages from t2-t3 can be floated or driven at a level such as 8 V which is to minimize reverse bias stress on a memory cells' junction. Specifically, when Vb1 is biased at 8 V to pre-charge the channel, the maximum channel potential is 8 V. If Vwl/Vcg is biased at 8 V, memory cell's junction sees 0 V. Because the maximum channel potential is 8 V, the channel potential is not high enough to erase the memory cell. Therefore, we bias Vcg at 8V at that time to minimize the reverse bias stress time on a memory cell's junction. The control gate voltages can be driven at Vss from t6-t7.

Figure 9B:
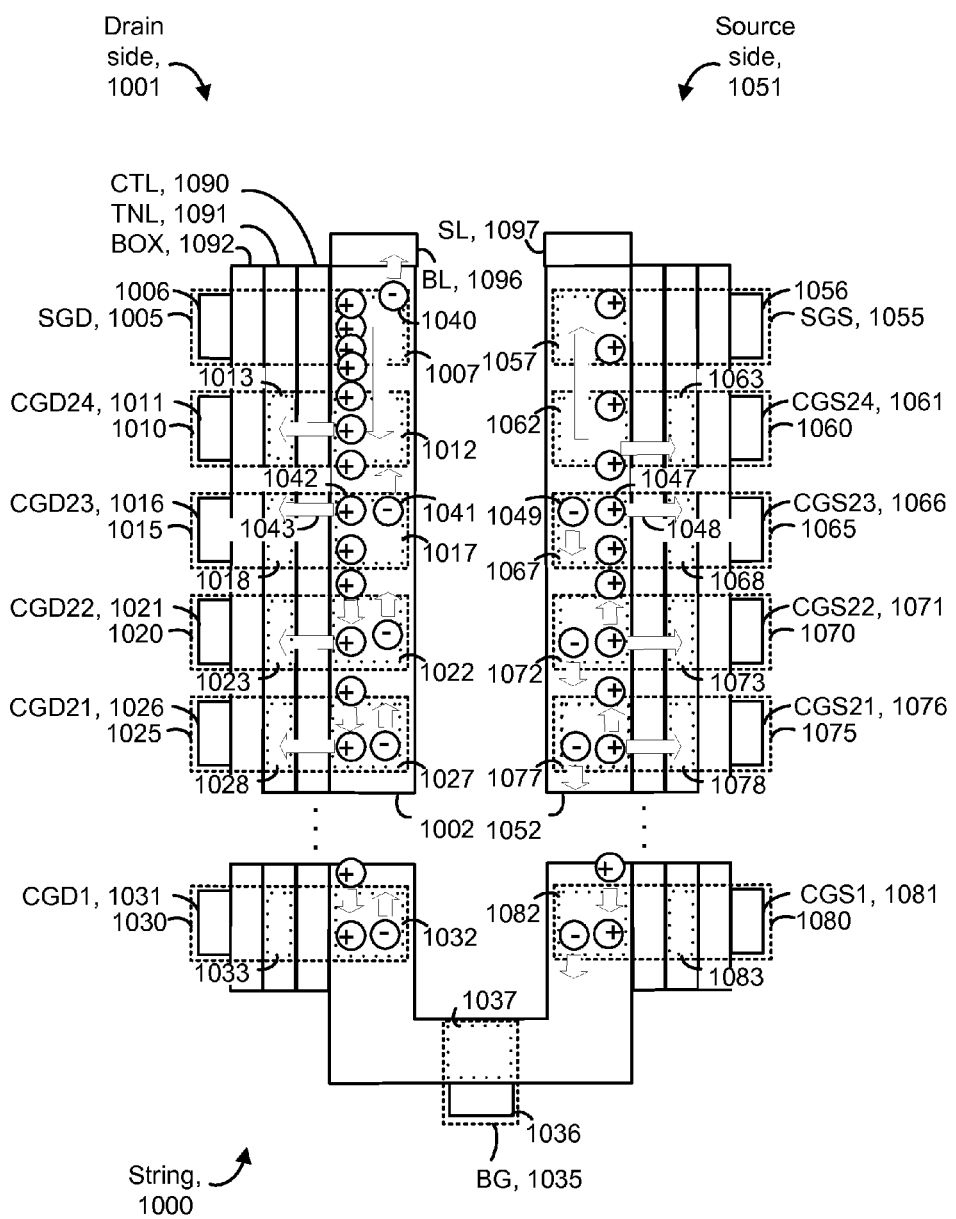
FIG. 9B depicts the movement of holes and electrons in a U-shaped NAND string during a one-sided erase.

FIGS. 8A-8C depict voltages in the verify portion of an erase-verify iteration of an erase operation. FIG. 8A depicts a bit line voltage 800. FIG. 9B depicts a SGS transistor and SGD transistor voltage 802. FIG. 8C depicts an unselected word line voltage 804 and a selected word line voltage 806. During the verify portion, the selected sets of NAND strings are sensed using sensing circuitry to determine whether the threshold voltages of the selected memory cells have passed the verify test. During the sensing, Vb1 is set to a sense voltage, Vsense. Vsgs and Vsgd are set to a level which renders them conductive. Vsgs and Vsgd can be set to the same or different levels. Vcg_unselected is a pass voltage which is set to a sufficiently high level, e.g., 8 V, to render the unselected memory cells in a conductive state. This could be referred to a Vread. Vcg_selected is set to Vv_erase. Sensing circuitry connected to a NAND string senses whether the NAND string is in a conductive state, which indicates the selected memory cells of the NAND string have been erased and therefore pass the verify test.

In one approach, all of the storage elements on the selected NAND string and in the selected pseudo block are verified at the same time. There is no need to verify storage elements in the unselected pseudo blocks, as they are not undergoing erase.

It may be possible to verify each storage element separately. For example, the verify voltage could be applied to a single word line, while all other word lines have the pass voltage (e.g., Vread) applied.

The erase operation may be a one-side erase operation or a two-sided erase operation. FIG. 9A depicts the movement of holes and electrons in a U-shaped NAND string during a two-sided erase. Consistent with the previous discussions, an example U-shaped NAND string 1000 includes a drain side 1001 and a source side 1051. The drain side includes a channel layer 1002 connected to a bit line 1096 which continues as a channel layer 1052 on the source side connected to a source line 1097. A charge trapping layer (CTL) 1090, a tunnel layer (TNL) 1091 and a block oxide (BOX) 1092 are ring shaped layers which extend around the memory hole of the string. Different regions of the channel layers represent channel regions which are associated with respective storage elements or select gate transistors. These channel regions are at a same height and stack level in the stacked memory device as the control gates of the storage elements or select gate transistors.

The drain side includes a SGD transistor 1005 with a control gate 1006 and a channel region 1007. The drain side also includes storage elements 1010, 1015, 1020, 1025 and 1030, control gates 1011, 1016, 1021, 1026 and 1031, CTL regions 1013, 1018, 1023, 1028 and 1033, and channel regions 1012, 1017, 1022, 1027 and 1032, respectively.

The source side includes a SGS transistor 1055 with a control gate 1056 and a channel region 1057. The source side also includes storage elements 1060, 1065, 1070, 1075 and 1080, control gates 1061, 1066, 1071, 1076 and 1081, CTL regions 1063, 1068, 1073, 1078 and 1083, and channel regions 1062, 1067, 1072, 1077 and 1082, respectively.

A back gate 1035 has a control gate 1036 and a channel region 1037.

Representative holes are depicted in the channel layers as circles with a "+" sign and representative electrons are depicted in the channel layers as circles with a "−" sign. As discussed previously, electron-hole pairs are generated by a GIDL process. Initially, during an erase operation, the electron-hole pairs are generated at the SGD and SGS transistors. The holes move away from the driven ends, thereby charging the channel. The electrons move toward the bit line due to the positive charge there. Subsequently, during the erase period of each storage element, additional holes are generated by GIDL at junctions which are formed in the channel for the storage element. However, holes are also removed from the channel as they tunnel to the CTL regions.

In this example, storage elements 1060, 1065, 1070, 1075 on the source side and storage elements 1010, 1015, 1020, 1025 on the drain side are being erased. This is represented by the arrows showing charge moving towards the CTL regions. However, storage elements 1080 and 1030 are not being erased, as they are part of a different pseudo block.

The voltage on the control gates of unselected storage elements (e.g., 1030, 1080) is high enough to generate GIDL, in one embodiment. However, the voltage is not so high that these unselected storage elements are erased. Thus, storage elements in unselected pseudo blocks are not erased. However, these storage elements may help to generated GIDL. Note that although only two unselected storage elements are depicted in FIG. 9A, up to all of the unselected storage elements can have a control gate voltage that is high enough to generate GIDL, in one embodiment.

Electrons are also generated by the GIDL process. Initially, during the erase operation, the electrons are generated at the SGD and SGS transistors and move toward the driven ends. Subsequently, during the erase period of each storage element, additional electrons are generated by GIDL at junctions which are formed in the channel for the storage element.

In the drain side, example electrons 1040 and 1041 move toward the bit line. Electron 1040 is generated at the SGD transistor and electron 1041 is generated at a junction of the storage element 1015 in the channel region 1017. Also, in the drain side, example holes including a hole 1042 move away from the bit line as indicated by arrows. The hole 1042 is generated at a junction of the storage element 1015 in the channel region 1017 and can tunnel into the CTL region 1018 as indicated by arrow 1043.

In the source side, example electrons 1045 and 1049 move toward the source line. Electron 1045 is generated at the SGS transistor and electron 1049 is generated at a junction of the storage element 1065 in the channel region 1067. Also, in the source side, example holes including a hole 1047 move away from the source line as indicated by the arrow. The hole 1047 is generated at a junction of the storage element 1065 in the channel region 1067 and can tunnel into the CTL region 1068 as indicated by arrow 1048.

FIG. 9B depicts the movement of holes and electrons in a U-shaped NAND string during a one-sided erase. The diagram of FIG. 9A is modified to show that the holes on the source side move in the opposite direction of FIG. 9A, away from the bit line end and toward the source line end. Similarly, the electrons on the source side move in the opposite direction of FIG. 9A, toward the bit line end and away from the source line end. As with FIG. 9A, storage elements 1060, 1065, 1070, 1075 on the source side and storage elements 1010, 1015, 1020, 1025 on the drain side are being erased. This is represented by the arrows showing charge moving towards the CTL regions. However, storage elements 1080 and 1030 are not being erased, as they are part of a different pseudo block. Also, the voltage on the control gates of unselected storage elements (e.g., 1030, 1080) is high enough to generate GIDL, in one embodiment. However, the voltage is not so high that these unselected storage elements are erased.

FIG. 10A depicts one embodiment of programming a pseudo block in pseudo block mode. This is one embodiment, of step 606 of FIG. 6A. It is also one embodiment of step 504 of FIG. 5D. This process describes programming a number of NAND strings in a given pseudo block. Up to all of the NAND strings in the pseudo block may be programmed Note that this refers to programming the portion of the NAND string that is in the selected pseudo block.

In step 632, a counter ("n") of the NAND string number is initialized. In step 634, memory cells on string "n" within the selected pseudo block are programmed There is no required order in which the memory cells should be programmed. As one example, the memory cells are programmed from the source end of the NAND string downward for this pseudo block. Then, the memory cells are programmed from the drain end of the NAND string downward for this pseudo block. Using FIG. 5A as one example, the memory cells of NAND string 1 might be programmed first. The order can be WL00, WL01, WL02, WL03, WL47, WL46, WL45, WL44, for pseudo block PB1.

As another example, programming alternates between the source side and the drain side of the NAND string, working downward. Using FIG. 5A as one example, the order can be WL00, WL47, WL01, WL46, WL02, WL45, WL03, WL44, for pseudo block PB1.

Note that when programming NAND string 1, there can be other NAND strings in the pseudo block that are associated with other bit lines that are also undergoing programming. For example, referring to FIG. 2C, other NAND strings associated with source line SLA0 can be programmed at the same time as NAND string NAS0. Specifically, storage elements associated with the selected word line can be programmed together. Note this refers to programming the portions of these NAND strings that are in the selected pseudo block. Suitable voltages can be applied to the different bit lines to control whether the NAND string undergoes programming or not. Programming may continue until the storage element associated with each of the NAND strings in the pseudo block is programmed.

In step 636, a determination is made whether there are more NAND strings in the pseudo block to program. Note that these other NAND strings may be associated with the same bit line as string 1. Referring to FIG. 5A, as one example, the next NAND string to program could be string 2, which is associated with the same bit line as string 1. If step 636 indicates more strings are to be programmed, the string count is incremented and control passes to step 634 to program the next string.

Figure 10B:
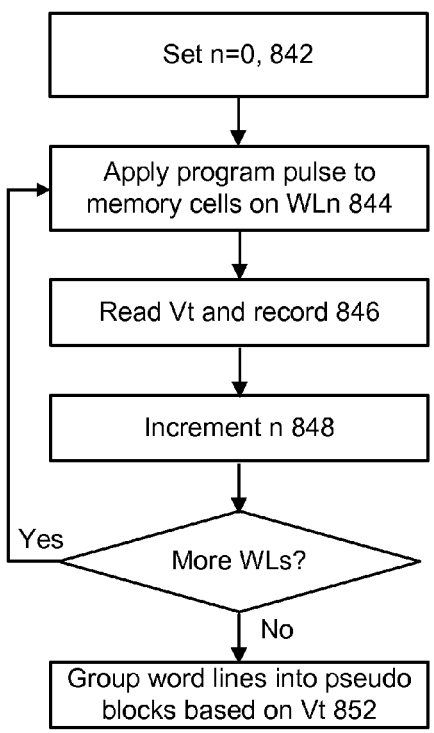
FIG. 10B is a flowchart of one embodiment of a process of grouping word lines into pseudo blocks.

FIG. 10B is a flowchart of one embodiment of a process of grouping word lines into pseudo blocks. This process is based on layer dependent programming speed of the storage elements. The programming speed may depend on the memory hole size. Therefore, this is one way of forming pseudo blocks based on memory hole size, without directly measuring memory hole size. The storage elements may be erased prior to this process to establish their threshold voltages. However, the storage elements could be programmed to some other threshold voltage.

This process will test memory cells on one word line at a time. In step 842, the word line number "n" is initialed to 0. In step 844, a program pulse is applied to memory cells on WLn. A single pulse may be used. However, using multiple pulses is not precluded.

In step 846, the threshold voltage of storage elements associated with WLn is recorded. In one technique, the storage elements are sensed at various levels to determine the threshold voltage within a suitable level of granularity. Step 846 could record one or more values that is representative of the threshold voltages. For example, an average Vt (median, mode, etc.) could be recorded. Any other statistical technique could be used to record a value representative of the Vts.

In step 848, the word line count (n) is incremented. Assuming that there are more word lines to process, control passes to step 844, to apply a program pulse to the next word line. Eventually, threshold voltages that are representative of each word line are recorded.

In step 852, the word lines are grouped into pseudo blocks based on the recorded Vts.

Figure 10C:
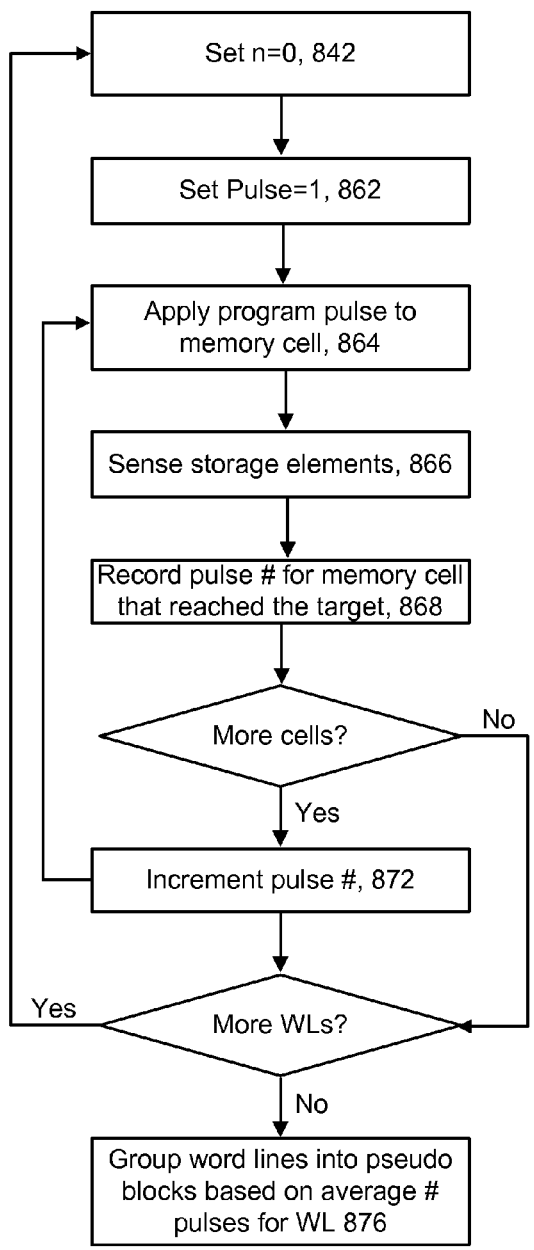
FIG. 10C is a flowchart of one embodiment of a process of grouping word lines into pseudo blocks.

FIG. 10C is a flowchart of one embodiment of a process of grouping word lines into pseudo blocks. Like the process of FIG. 10B, this process is also based on layer dependent programming speed of the storage elements. However, rather than applying a pulse and testing the Vt, this process tests how many pulses it takes to reach a target Vt. The storage elements may be erased prior to this process to establish their threshold voltages. However, the storage elements could be programmed to some other threshold voltage.

In step 842, the word line number "n" is initialed to 0. In step 862 a pulse count is initialized to "1". In step 864, a program pulse is applied to memory cells on WLn. A single pulse may be used. However, using multiple pulses is not precluded.

In step 866, the storage elements associated with WLn are sensed to determine whether their Vt is at a target Vt. In step 868, the pulse number is recorded for memory cells that have reached the target Vt. Step 870 determines whether there are more cells to test. If so, the pulse count is incremented in step 872. Control then passes to step 864 to apply the next program pulse. Eventually, when enough memory on this word line reach the target Vt (not all have to pass), control passes to step 874, to determine whether there are more word lines to test. If so, then control passes to step 842 to increment the word line count. Eventually all of the word lines are tested and control passes to step 876.

In step 876, the word lines are grouped into pseudo blocks based on how many pulses it took memory cells on each word line to reach the target Vt. Any statistical technique can be used to characterize the pulse count for a given word line (e.g., median, mean, etc.).

FIGS. 10B and 10C discussed two ways to form pseudo blocks based on programming speed. As noted, programming speed may correlate to memory hole size. Programming speed may correlate to other factors as well. Thus, the grouping into pseudo blocks based on programming speed may be effective at forming pseudo blocks based on other factors.

The techniques of FIGS. 10B and 10C could be combined. For example, the word lines can be grouped into pseudo blocks based on analysis of both the Vt from the process of FIG. 10B and the count of the process of FIG. 10C.

Figure 10D:
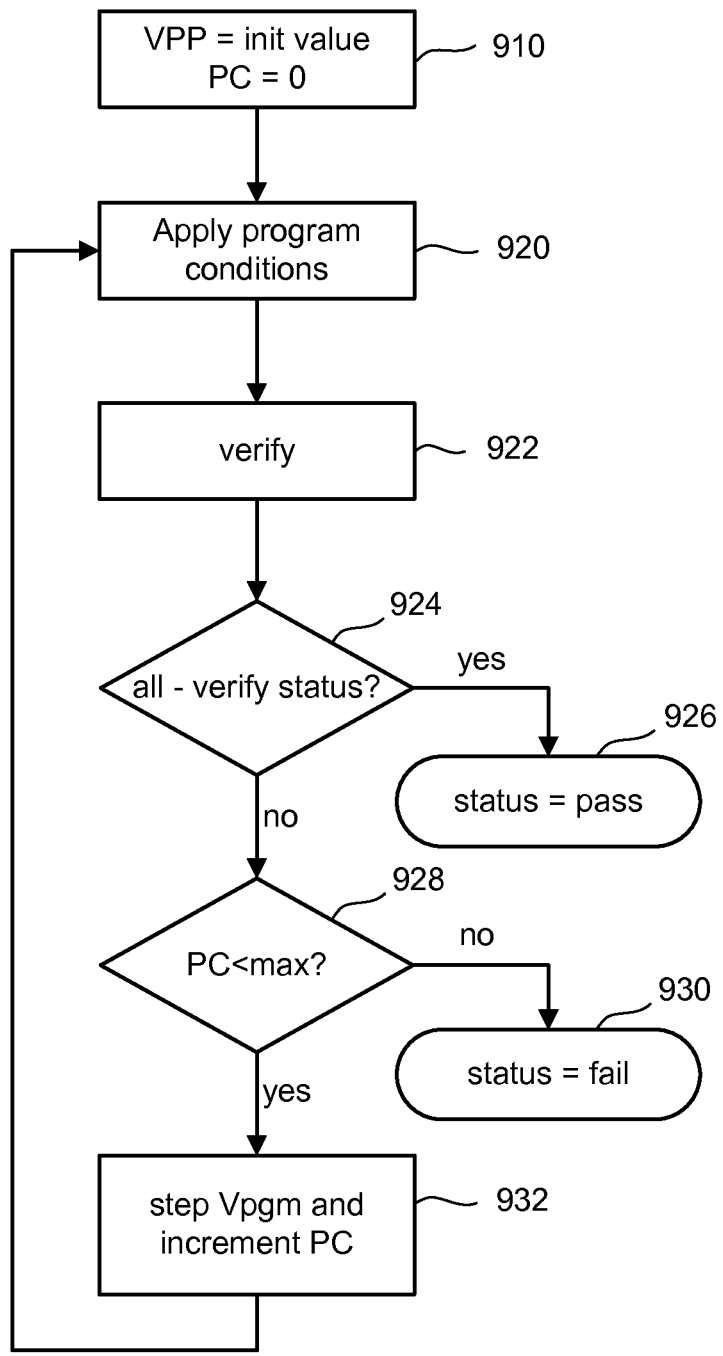
FIG. 10D is a flowchart describing one embodiment of a programming process 900, which includes one or more verification steps.

FIG. 10D is a flowchart describing one embodiment of a programming process 900, which includes one or more verification steps. This process can be used to program memory cells associated with a selected word line. In step 910, the program voltage (Vpgm) is set to an initial value. This initial value depends on which pseudo block is being programmed, in one embodiment. That is, it depends on which pseudo block the selected word line is in. Also, in step 910, a program counter (PC) is initialized to zero.

In step 920, program conditions are applied. These program conditions may include, but are not limited to, a program voltage applied to the selected word line. Other program conditions such as voltages to selected bit lines, unselected bit lines, unselected word lines, and select gates may be applied in step 920. For example, a program enable voltage (e.g., 0V) can be applied to selected bit lines, whereas a program inhibit voltage (e.g., Vdd) may be applied to unselected bit lines. In one embodiment, boosting voltages are applied to unselected word lines. The magnitude of the boosting voltages depends on the pseudo block in which the boosting voltage is applied, in one embodiment. Further details are described below.

In step 922, a verification process is performed. Note that when a particular memory cell has been verified as being programmed to its intended state, it may be locked out from further programming. The memory cell can be inhibited from further programming while boosting the NAND string channel, in one embodiment.

In step 924, it is determined whether memory cells have verified that their threshold voltages are at the final target voltage for that memory cell. Note that it is not required that every memory cell for a given state is verified to be at the appropriate threshold voltage. Error correction is able to correct for some memory cells being above their target threshold voltage. Error correction is able to correct for some memory cells being over-programmed to a Vt that is lower than the target Vt distribution. Step 924 is referring to all states having completed programming.

If verification passes, the programming process is completed successfully (status=pass) in step 926. If all of the memory cells are not all verified, then it is determined whether the program counter (PC) is less than a maximum value such as 20. If the program counter (PC) is not less than max (step 928), then the program process has failed (step 930). If the program counter (PC) is less than a maximum value (e.g., 20), then the program counter (PC) is incremented by 1 and the program voltage is stepped up to the next pulse in step 932. Subsequent to step 932, the process loops back to step 920 and the next set of program conditions are applied to the memory cells.

Pseudo Block Read Disturb Operation

One operation that is performed in a pseudo block operation mode is a pseudo block read disturb operation. The read disturb characteristics may vary between storage elements in a 3D memory device. As one possibility, the size of the memory hole affects read disturb characteristics. In one embodiment, storage elements are grouped into pseudo blocks based on read disturb characteristics. For example, those with similar read disturb characteristics may be grouped together. This grouping can minimize the negative impact of read disturb without relaxing the entire specification. Some pseudo blocks will be able to withstand a greater number or reads (or read time) than others. Therefore, a higher endurance pseudo block can be operated longer than a lower endurance pseudo block.

Figure 11A:
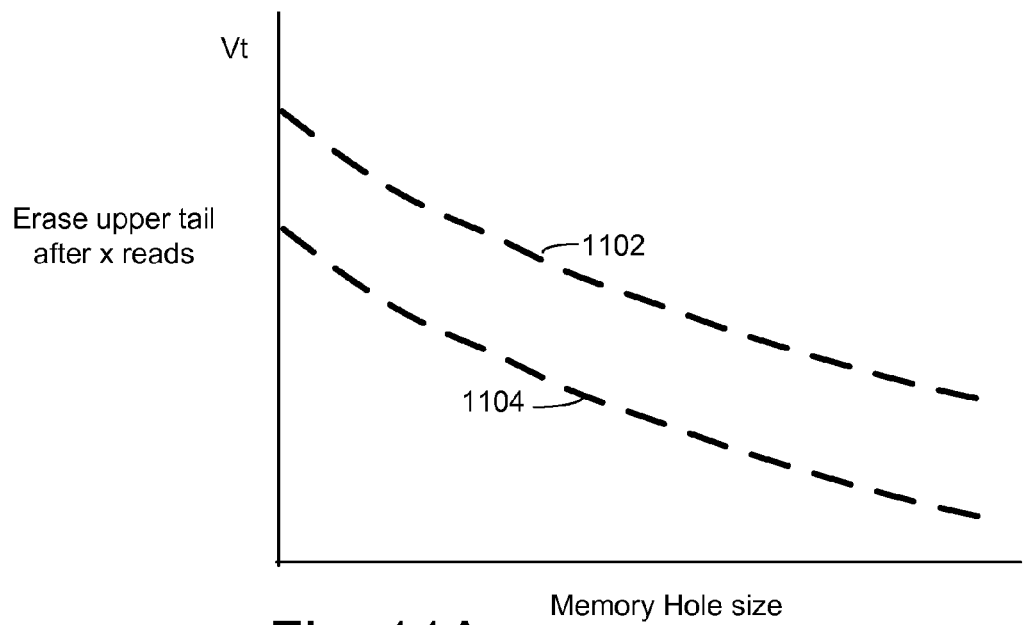
FIG. 11A shows two curves that represent how read disturb can be worse for smaller memory holes.

For some 3D memory devices, read disturb is worse for storage elements having smaller memory holes. FIG. 11A shows two curves that represent how read disturb can be worse for smaller memory holes. The curves 1102, 1104 show erase state upper tail after a test number of reads versus memory hole size. For example, memory cells are read a large number of times to determine the effect on the upper tail of the erase state distribution. A greater voltage corresponds to more read disturb. The two curves are for two different read voltages applied to the control gate of the memory cells. Both curves 1102, 1104 show that there is more read disturb (higher Vt) for memory cells having smaller memory holes. Curve 1102 is for a greater Vread than curve 1104, showing more disturb.

Figure 11B:
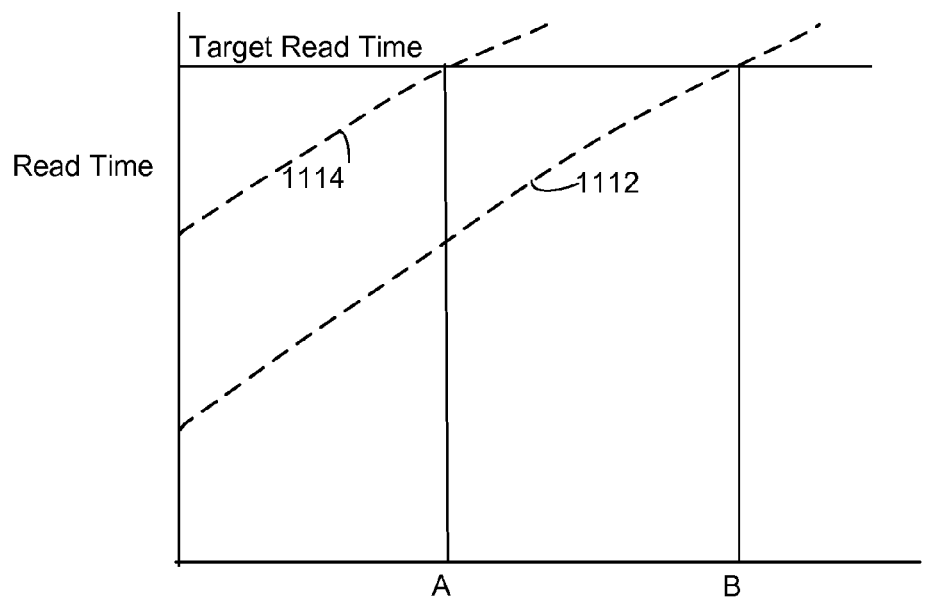
FIG. 11B shows read access time versus memory hole size for two different read voltages.

FIG. 11B shows read access time versus memory hole size for two different read voltages. Curve 1112 is for a higher Vread than curve 1114. The target read time may be based on a target Vt window. The curves should reach or exceed the target read time (longer read time corresponds to better endurance). Each curve 1112, 1114 shows a larger memory hole is helpful to reach the target read time. Conversely, if the memory hole is too small, then the target read time may not be met. For example, curve 1114 fails to reach the target read time for memory holes smaller than "A" units. Curve 1112 fails to reach the target read time for memory holes smaller than "B" units.

Figure 11C:
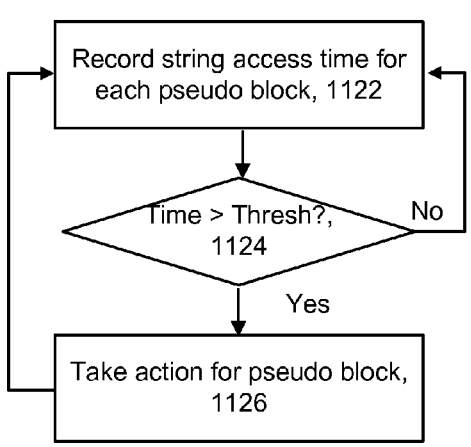
FIG. 11C is a flowchart of one embodiment of a process of a read disturb pseudo operation mode.

FIG. 11C is a flowchart of one embodiment of a process of a read disturb pseudo operation mode. This is one embodiment of step 504 of FIG. 5D. In step 1122, a string read access time is recorded for each pseudo block. It is not necessary to measure the actual time of access. Rather, the number of times that the pseudo block is read could be recorded. The access time can be estimated based on the number of reads.

In one embodiment, reads are typically performed one word line at a time. The read count may be of how many times a word line was read in the pseudo block. It is not required that a separate count be made of each of the word lines. Rather, the count can be cumulative for all of the word lines in the pseudo block. Other techniques can be used to accumulate a count of reads in the pseudo block.

In step 1124, a determination is made whether the read access time for given pseudo block is greater than a threshold for that pseudo block. This threshold could be expressed as a number of reads. Each pseudo block may have its own threshold. For example, referring to FIG. 11B, a pseudo block having smaller memory holes might have a lower threshold (e.g., smaller number of reads). As noted, pseudo blocks having smaller memory holes can be more susceptible to read disturb. Therefore, the lower threshold allows the pseudo block to meet the target. On the other hand, pseudo blocks having larger memory holes can have a higher threshold. Such pseudo blocks can be operated longer without failing.

Step 1126 is to take an action for the pseudo block in the event that the threshold is exceeded. One option is to mark the pseudo block as a bad block such that it is no longer used. Its data can be transferred to another block. Another option is to re-program the pseudo block.

Figure 11D:
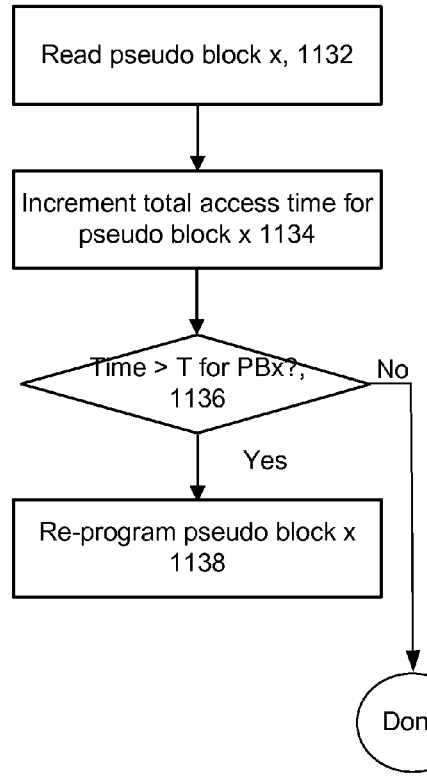
FIG. 11D and FIG. 11E are flowcharts depicting two different embodiments for performing a pseudo block read disturb operation.
Figure 11E:
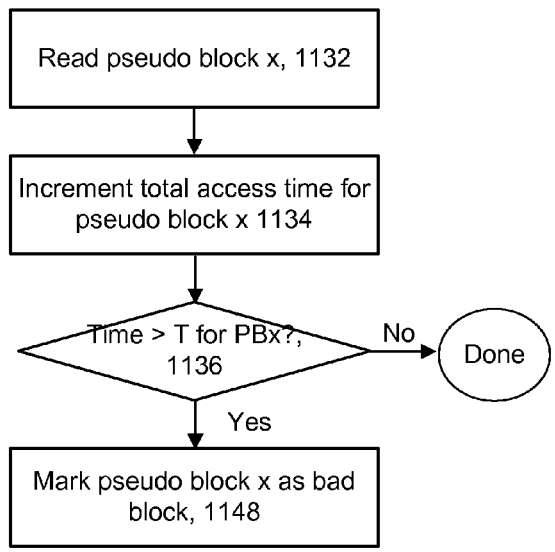

FIG. 11D and FIG. 11E are flowcharts depicting two different embodiments for performing a pseudo block read disturb operation. These flows show greater detail for the process of FIG. 11C. FIG. 11D describes one embodiment in which the pseudo block is re-programmed when the read time crosses a threshold. In step 1132, the pseudo block is read. This could be a read of any size unit in the pseudo block. Thus, it will be understood that it is not required that the entire pseudo block be read in step 1132. In one embodiment, step 1132 is for a read of a word line. However, this is just one possibility.

In step 1134, the total access time for the pseudo block is incremented. This is achieved by incrementing a counter of the number of read accesses, in one embodiment. This counter may be re-set whenever the pseudo block is re-programmed.

In step 1136, the total read time is compared to a total read time threshold for this pseudo block. The total read time threshold is expressed as a maximum allowed number of read accesses in one embodiment. If the total read time exceeds the threshold, then the pseudo block is re-programmed in step 1138. Otherwise, the process ends.

FIG. 11E describes one embodiment in which the pseudo block is marked as bad when the read time crosses a threshold. The process is similar to the one of FIG. 11D. Similar numbered steps may be similar in the two processes. A difference is that, in step 1148, the pseudo block is marked as bad if the total read time exceeds the threshold.

Pseudo Block Endurance Operation

One operation that is performed in a pseudo block operation mode is a pseudo block endurance operation. Endurance refers to how many erase/program cycles that a storage element can endure. The tunnel oxide is one component that may be damaged. For some 3D memory device, a storage element having a smaller memory hole has better endurance. For some 3D memory device, erase damages the storage element more than program.

For some 3D memory devices, a larger erase voltage is needed to successfully erase storage elements having larger memory holes. Recall that FIG. 6F shows that storage elements having a smaller memory hole can be easier to erase. This means that such storage elements might be erased with a smaller erase voltage. Thus, such storage elements might be damaged less during a given erase process relative to ones with larger memory holes.

FIG. 12A shows expected endurance characteristics as a function of memory hole size. The y-axis is the number of program/erase cycles. The x-axis is memory hole size. The curve shows that for a larger memory hole size, endurance is expected to be worse.

FIG. 12B is a flowchart of one embodiment of a process of a pseudo block endurance mode of operation. The process is one embodiment of step 504 of FIG. 5D. In step 1202, program/erase cycles are recorded for each pseudo block.

In step 1204, a determination is made whether the cycle number for a given pseudo block is greater than a threshold for that pseudo block. Each pseudo block may have its own endurance threshold. For example, referring to FIG. 12A, a pseudo block having larger memory holes might have a lower threshold (e.g., fewer cycles). As noted, pseudo blocks having larger memory holes might have lower endurance. Therefore, the lower endurance threshold allows the pseudo block to operate without failure. On the other hand, pseudo blocks having smaller memory holes can have a higher threshold. Such pseudo blocks can be operated longer without failing. Note that if the same endurance threshold were applied to all storage elements, this hypothetical endurance threshold might need to small enough such that storage elements having the largest memory holes could meet the target endurance (see FIG. 12A). However, by having a pseudo block dependent endurance threshold, pseudo blocks having smaller memory holes can successfully undergo greater numbers of cycles. Therefore, overall the number of cycles can be improved.

Step 1206 is to make the pseudo block as failed, in response to the endurance threshold for the pseudo block having been exceeded.

FIG. 12C is a flowchart for one embodiment of a process of pseudo block endurance mode of operation. This process depicts specific operation for a certain pseudo block, thereby providing more details for the process of FIG. 12B. In step 1212, a request to erase a pseudo block is received. In step 1214, the erase/program cycle count for this pseudo block is incremented. In step 1216, a cycle limit for this pseudo block is accessed. As noted, each pseudo block may have its own endurance threshold (or cycle limit). Step 1218 determines whether erasing this pseudo block would exceed the cycle limit. If so, then this pseudo block is marked as bad, in step 1220. In step 1222, a failure message is sent to the controller. The controller may then take a suitable action, such as requesting that a different pseudo block be allocated for erase/program. If step 1218 determines that the cycle is not yet reached, the process of FIG. 6H may be used to erase the pseudo block.

Pseudo Block Boosting Operation

One operation that is performed in a pseudo block operation mode is a pseudo block boosting operation. Boosting refers to boosting the channel potential of strings that are inhibited from programming during a programming operation. Boosting the channel potential helps to reduce or prevent program disturb. Boosting involves applying a boosting voltage to word lines that are not selected for programming. There are many different boosting schemes.

For some 3D memory devices boosting is less effective for storage elements having larger memory holes. Note that for an architecture such as depicted in FIG. 5A, a program voltage is applied to a selected word line, whereas boosting voltages may be applied to unselected words. For example, the selected word line might be WL45, which is in pseudo block PB1, in that example. Thus, boosting voltages could be applied to word lines in any (or all) of the pseudo blocks. In one embodiment, the boosting voltage that is applied to the control gate depends on which pseudo block the storage element is in. However, also note that the boosting voltage may depend on the relative location of the unselected word line to the selected word line. This will be further discussed below.

Since for some 3D memory devices, a larger memory hole may have worse boosting, the boosting voltage depends on the memory hole size, in one embodiment. This may be achieved by having the boosting voltage depend on the pseudo block.

Figure 13A:
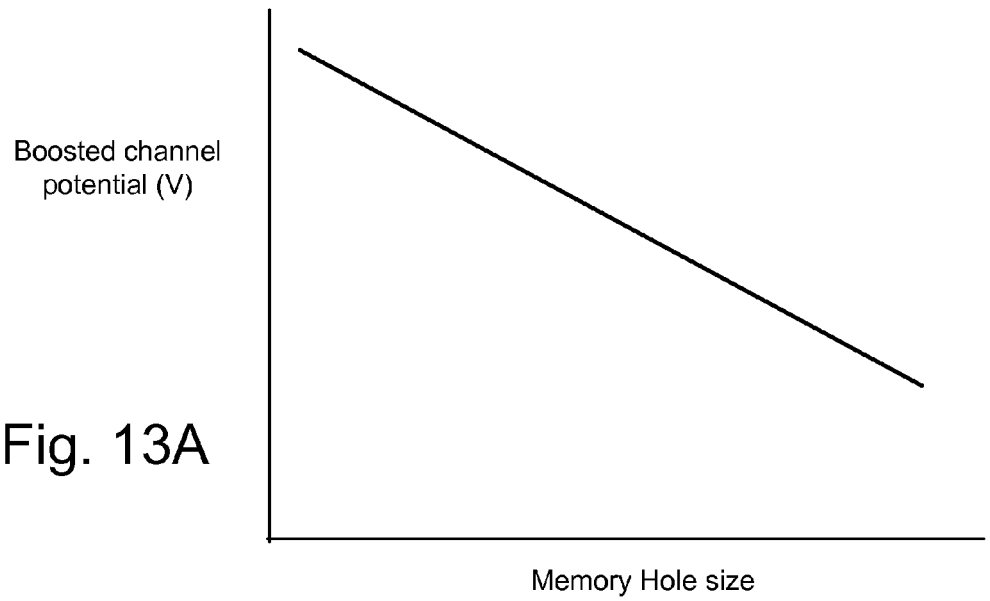
FIG. 13A shows a relationship between boosted channel potential versus memory hole size for one example 3D memory device.

FIG. 13A shows a relationship between boosted channel potential versus memory hole size for one example 3D memory device. The curve shows the channel potential for some arbitrary boosting voltage $V_{PASS}$ applied to the unselected word line(s). The curve shows that channel potential is expected to be lower for larger memory holes.

A larger boosting voltage ($V_{PASS}$) can be used to increase the channel potential. However, using a larger $V_{PASS}$ may result in greater $V_{PASS}$ disturb. $V_{PASS}$ disturb refers to the impact of $V_{PASS}$ on storage elements that are already programmed Storage elements having a smaller memory hole may suffer more from $V_{PASS}$ disturb than those with larger memory holes. This effect may be similar to how read disturb may be worse for storage elements having a smaller memory hole.

Figure 13B:
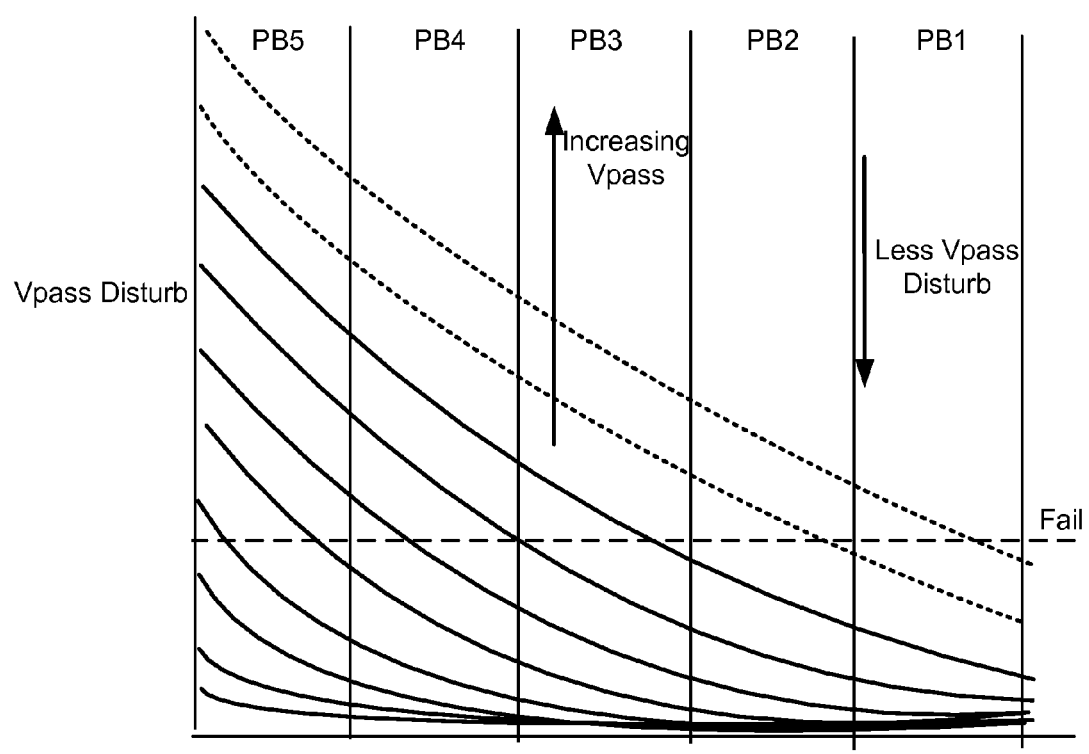
FIG. 13B shows $V_{PASS}$ disturb versus memory hole size for several values of $V_{PASS}$.

FIG. 13B shows $V_{PASS}$ disturb versus memory hole size for several values of $V_{PASS}$. Each curve represents a different value of $V_{PASS}$. The arrow shows that the higher curves are those for higher $V_{PASS}$. Lower y-axis values correspond to less $V_{PASS}$ disturb. The fail line represents a maximum amount of read disturb that is tolerable to meet an arbitrary specification. FIG. 13B shows that for smaller memory holes, the tolerance level is reached when using a smaller $V_{PASS}$. This suggests that smaller memory holes should have a smaller $V_{PASS}$ to meet a read disturb specification.

Moreover, by using a smaller $V_{PASS}$ for smaller memory holes, the read disturb specification can be met for all memory cells without relaxing the read disturb specification. In other words, a larger $V_{PASS}$ can be used for larger memory holes while still meeting the read disturb specification.

FIG. 13B also shows one possible way of dividing the layers of storage elements into pseudo blocks (PB1-PB5). Referring again to FIG. 5A, PB1 has the largest memory holes (higher layers) and PB5 has the smallest memory holes (lowest layer), for that example. Thus, PB1 (having largest memory holes) might use higher values of $V_{PASS}$, whereas PB5 (having smallest memory holes) might use lower values of $V_{PASS}$. Pseudo blocks PB2-PB4 can use progressively lower values for $V_{PASS}$, according to their memory hole sizes.

Figure 13C:
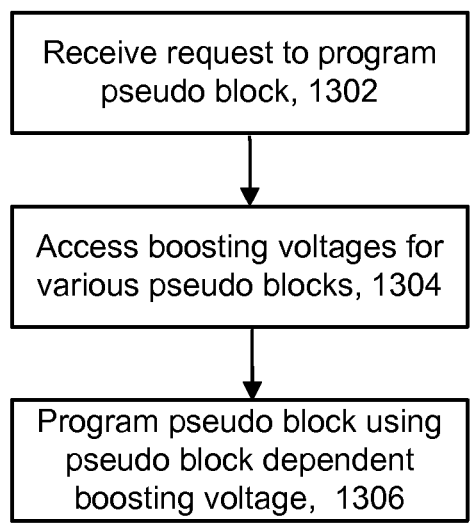
FIG. 13C is a flowchart of one embodiment of a process of a pseudo block dependent $V_{PASS}$ operation.

FIG. 13C is a flowchart of one embodiment of a process of a pseudo block dependent $V_{PASS}$ operation. The process is one embodiment of step 504 of FIG. 5D. In step 1302 a request is received to program a pseudo block. In step 1304, boosting voltages ($V_{PASS}$) are accessed for various pseudo blocks. Note that the boosting voltages will be applied to unselected word lines in other pseudo blocks (and possibly in the pseudo block having the selected word line).

In step 1306, the pseudo block is programmed using pseudo block dependent boosting voltages. Step 1306 includes applying a boosting voltage to a control gate of an unselected non-volatile storage element on the NAND string that is not selected for programming That is, the boosting voltage is applied to an unselected word line. The magnitude of the boosting voltage depends on location of the unselected non-volatile storage element (and hence the unselected word line) on the NAND string.

For purposes of illustration, the following is one example boosting scheme. It will be understood that other boosting schemes can benefit from a pseudo block dependent $V_{PASS}$ operation.

TABLE I

| Voltage | WL | Example Voltages |
|---|---|---|
| Vpgm | WLn | Vpgm (varies) |
| Vpass3 | WLn − 1, WLn + 1 | 6.5 V-12.5 V |
| Vpass2 | all other WLs | 6.5 V-11.5 V |
| Vpass1 | WLn − 7, WLn + 7 | 6.5 V-8.5 V |
| VGP1/2 | WLn − 6, WLn − 4, WLn + 4, WLn + 6 | 4.5 V |
| VISO | WLn − 5, WLn + 5 | 0.5 V |

Note that it is not required that all of the boosting voltages have their value depend on the pseudo block. As one example, the boosting voltages Vpass2 and Vpass3 have their values depend on the pseudo block in which the boosting voltage is applied. However, Vpass1, VGP1/2 and VISO are not dependent on the pseudo block. However, any of Vpass1, VGP1/2 and VISO could depend on the pseudo block in which they are applied.

The following table shows one possible scheme for a pseudo block dependent Vpass3. In this example, Vpass3 is a nominal value. The pseudo blocks refer to an example such as in FIG. 5A, in which PB1 to PB5 have progressively smaller memory holes.

TABLE II

| Pseudo Block | Voltage |
|---|---|
| PB5 | Vpass3 |
| PB4 | Vpass3 + Vpass3_shift1 |
| PB3 | Vpass3 + Vpass3_shift2 |
| PB2 | Vpass3 + Vpass3_shift3 |
| PB1 | Vpass3 + Vpass3_shift4 |

The following table shows one possible scheme for a pseudo block dependent Vpass2. In this example, Vpass2 is a nominal value. The pseudo blocks refer to an example such as in FIG. 5A, in which PB1 to PB5 have progressively smaller memory holes.

TABLE III

| Pseudo Block | Voltage |
|---|---|
| PB5 | Vpass2 |
| PB4 | Vpass2 + Vpass2_shift1 |
| PB3 | Vpass2 + Vpass2_shift2 |
| PB2 | Vpass2 + Vpass2_shift3 |
| PB1 | Vpass2 + Vpass2_shift4 |

One embodiment disclosed herein includes a 3D NAND stacked non-volatile memory device, comprising a plurality of NAND strings and a control circuit in communication with the NAND strings. Each NAND string comprises a plurality of non-volatile storage elements. Each NAND string comprises a channel that extends vertically through layers of the 3D NAND stacked non-volatile memory device. The block is divided into pseudo blocks that each comprise a portion of each of the NAND strings. Each of the NAND strings is a member of each of the pseudo blocks. The control circuit operates in a pseudo block operation mode that performs operations on a pseudo block level.

One embodiment disclosed herein includes a method of operating a 3D NAND stacked non-volatile memory device comprising a plurality of NAND strings in a block. Each NAND string comprises a plurality of non-volatile storage elements. Each NAND string comprises a channel that extends vertically through layers of the 3D NAND stacked non-volatile memory device. The block is divided into pseudo blocks that each comprise a portion of each of the NAND strings. Each of the NAND strings is a member of each of the pseudo blocks. The method comprises performing operations on a pseudo block level.

One embodiment disclosed herein includes a 3D NAND stacked non-volatile memory device, comprising a plurality of NAND strings and a control circuit in communication with the NAND strings. The NAND string comprises a channel that extends vertically through layers of the 3D NAND stacked non-volatile memory device. The control circuit is configured to perform an erase of a portion of the NAND string while leaving other non-volatile storage elements on the NAND string programmed.

One embodiment disclosed herein includes a 3D NAND stacked non-volatile memory device, comprising a plurality of NAND strings and a control circuit in communication with the NAND strings. The control circuit is configured to apply a boosting voltage to a control gate of an unselected non-volatile storage element on the NAND string that is not selected for programming A magnitude of the boosting voltage depends on location of the unselected non-volatile storage element on the NAND string.

The foregoing detailed description of embodiments of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A three-dimensional (3D) NAND stacked non-volatile memory device, comprising:
    a plurality of NAND strings in a block, each NAND string comprising a plurality of non-volatile storage elements, each NAND string comprising a channel that extends vertically through layers of the 3D NAND stacked non-volatile memory device, wherein the block comprises pseudo blocks that each comprise a portion of each of the NAND strings, wherein each of the NAND strings is a member of each of the pseudo blocks; and
    a control circuit in communication with the NAND strings, the control circuit is configured to operate in a pseudo block operation mode that performs operations on the plurality of NAND strings on a pseudo block level.

2. The 3D NAND stacked non-volatile memory device of claim 1, wherein the control circuit configured to operate in the pseudo block operation mode comprises the control circuit configured to:
    erase all non-volatile storage elements in a first pseudo block in the block without erasing storage elements in any of the other pseudo blocks in the block, wherein non-volatile storage elements in at least one of the other pseudo blocks in the block remain programmed after erasing all the non-volatile storage elements in the first pseudo block.

3. The 3D NAND stacked non-volatile memory device of claim 1, wherein the control circuit configured to operate in the pseudo block operation mode comprises the control circuit configured to:
  erase all non-volatile storage elements on a first NAND string of the plurality of NAND strings that are in a first pseudo block in the block without erasing any storage elements on the first NAND string that are in any of the other pseudo blocks in the block.

4. The 3D NAND stacked non-volatile memory device of claim 1, wherein the control circuit configured to operate in the pseudo block operation mode comprises the control circuit configured to:
  program all storage elements in a first pseudo block in the block prior to programming any storage element in at least one other pseudo block in the block.

5. The 3D NAND stacked non-volatile memory device of claim 1, wherein the control circuit configured to operate in the pseudo block operation mode comprises the control circuit configured to:
  erase the storage elements using different starting erase voltages for different pseudo blocks in the block.

6. The 3D NAND stacked non-volatile memory device of claim 1, wherein the control circuit configured to operate in the pseudo block operation mode comprises the control circuit configured to:
  for each of the pseudo blocks in the block, record access times to read the non-volatile storage elements in the respective pseudo block; and
  determine whether the access time for each respective pseudo block exceeds a limit for the respective pseudo block.

7. The 3D NAND stacked non-volatile memory device of claim 6, wherein at least two of the pseudo blocks have a different limit.

8. The 3D NAND stacked non-volatile memory device of claim 1, wherein the control circuit configured to operate in the pseudo block operation mode comprises the control circuit configured to:
  for each of the pseudo blocks in the block, record the number of program/erase cycles for the respective pseudo block; and
  determine whether the number of program/erase cycles for each respective pseudo block exceeds a limit for the respective pseudo block.

9. The 3D NAND stacked non-volatile memory device of claim 8, wherein at least two of the pseudo blocks have a different limit.

10. The 3D NAND stacked non-volatile memory device of claim 1, wherein the control circuit configured to operate in the pseudo block operation mode comprises the control circuit configured to:
  apply boosting voltage to a control gate of non-volatile storage elements in the block that are not selected for programming whose magnitude depends on which pseudo block that the non-volatile storage element to which the boosting voltage is applied is in.

11. The 3D NAND stacked non-volatile memory device of claim 1, wherein each of the non-volatile storage elements is characterized by a memory hole size, the plurality of storage elements are associated with the pseudo blocks based on memory hole size.

12. The 3D NAND stacked non-volatile memory device of claim 1, wherein the control circuit is configured to subdivide the non-volatile storage elements in the block into the pseudo blocks based on a program speed of the respective non-volatile storage elements.

13. The three-dimensional stacked non-volatile memory device of claim 1, wherein the control circuit configured to operate in the pseudo block operation mode comprises the control circuit configured to:
  perform an operation on a first of the pseudo blocks and not on other pseudo blocks associated with the plurality of NAND strings in the block.

14. The three-dimensional stacked non-volatile memory device of claim 1, wherein the control circuit configured to operate in the pseudo block operation mode comprises the control circuit configured to:
  perform an operation with respect to a first non-volatile storage element of a first of the plurality of NAND strings that is dependent on the pseudo block with which the first non-volatile storage element is associated.

15. A method of operating a three-dimensional (3D) NAND stacked non-volatile memory device comprising a plurality of NAND strings in a block, each NAND string comprising a plurality of non-volatile storage elements, each NAND string comprising a channel that extends vertically through layers of the 3D NAND stacked non-volatile memory device, wherein the block comprises pseudo blocks that each comprise a portion of each of the NAND strings, wherein each of the NAND strings is a member of each of the pseudo blocks, the method comprising:
  performing operations associated with the plurality of NAND strings in the block on a pseudo block level.

16. The method of claim 15, wherein performing operations on a pseudo block level comprises:
  erasing non-volatile storage elements in a first pseudo block in the block without erasing storage elements in any of the other pseudo blocks in the block, including erasing all non-volatile storage elements on a first NAND string of the plurality of NAND strings that are in a first pseudo block in the block without erasing any storage elements on the first NAND string that are in any of the other pseudo blocks in the block, wherein non-volatile storage elements on the first NAND string in at least one of the other pseudo blocks in the block remain programmed after erasing all the non-volatile storage elements on the first NAND string in the first pseudo block.

17. The method of claim 15, wherein the block is associated with a plurality of bit lines, a group of the plurality of NAND strings are associated with a first bit line of the bit lines, the group includes a first NAND string, wherein performing operations on a pseudo block level comprises:
  programming the storage elements associated with the first NAND string that in a first pseudo block in the block without programming any storage elements on the first NAND string in the other pseudo blocks in the block; and
  then programming the storage elements associated with remaining NAND strings associated with the first bit line that are in the first pseudo block without programming any storage elements on the remaining NAND strings in the other pseudo blocks in the block.

18. The method of claim 15, wherein performing operations on a pseudo block level comprises:
  erasing the storage elements using different starting erase voltages for different pseudo blocks in the block.

19. The method of claim 15, wherein performing operations on a pseudo block level comprises:
  for each of the pseudo blocks in the block, recording access times to read the non-volatile storage elements in the respective pseudo block; and determining whether the access time for each respective pseudo block exceeds a limit for the respective pseudo block, wherein at least two of the pseudo blocks have a different limit for the access time.

20. The method of claim 15, wherein performing operations on a pseudo block level comprises:
for each of the pseudo blocks in the block, recording the number of program/erase cycles for the respective pseudo block; and
determining whether the number of program/erase cycles for each respective pseudo block exceeds a limit for the respective pseudo block, wherein at least two of the pseudo blocks have a different limit for the program/erase cycles.

21. The method of claim 15, wherein performing operations on a pseudo block level comprises:
applying a boosting voltage to a control gate of non-volatile storage elements in the block that are not selected for programming whose magnitude depends on which pseudo block that the non-volatile storage element to which the boosting voltage is applied is in.

22. The method of claim 15, further comprising subdividing the non-volatile storage elements in the block into the pseudo blocks based on a programming speed of the respective non-volatile storage elements.

23. The method of operating a three-dimensional stacked of claim 15, wherein the performing operations associated with the plurality of NAND strings in the block on the pseudo block level comprises:
performing an operation on a first of the pseudo blocks and not on other pseudo blocks associated with the plurality of NAND strings in the block.

24. The method of operating a three-dimensional stacked of claim 15, wherein the performing operations associated with the plurality of NAND strings in the block on the pseudo block level comprises:
performing an operation with respect to a first non-volatile storage element of a first of the plurality of NAND strings that is dependent on the pseudo block in which the first non-volatile storage element resides.

25. A three dimensional (3D) NAND stacked non-volatile memory device, comprising:
a NAND string comprising a plurality of non-volatile storage elements, the NAND string comprises a channel that extends vertically through layers of the 3D NAND stacked non-volatile memory device; and
a control circuit in communication with the NAND string, wherein the control circuit is configured to perform an erase of a portion of the NAND string while leaving other non-volatile storage elements on the NAND string programmed.

26. The 3D NAND stacked non-volatile memory device of claim 25, wherein the control circuit is configured to apply voltages to control gates of non-volatile storage elements that are unselected for erase that generates GIDL in the channel.

27. A three dimensional (3D) NAND stacked non-volatile memory device, comprising:
a NAND string comprising a plurality of non-volatile storage elements, the NAND string comprises a channel that extends vertically through layers of the 3D NAND stacked non-volatile memory device, wherein the NAND string comprises memory cells that reside in a memory hole in the layers; and
a control circuit in communication with the NAND string, the control circuit is configured to apply a boosting voltage to a control gate of an unselected non-volatile storage element on the NAND string that is not selected for programming, a magnitude of the boosting voltage depends on location of the unselected non-volatile storage element on the NAND string, wherein a magnitude of the boosting voltage for a given memory cell depends on a size of the memory hole associated with the given memory cell.

28. The 3D NAND stacked non-volatile memory device of claim 27, wherein the magnitude of the boosting voltage is larger for memory cells associated with larger memory holes.

29. The 3D NAND stacked non-volatile memory device of claim 27, wherein the magnitude of the boosting voltage is progressively smaller as the size of the memory hole is smaller.

* * * * *

UNITED STATES PATENT AND TRADEMARK OFFICE
CERTIFICATE OF CORRECTION

PATENT NO.        : 8,923,054 B1  
APPLICATION NO.   : 14/152848  
DATED             : December 30, 2014  
INVENTOR(S)       : Costa et al.

Page 1 of 1

It is certified that error appears in the above-identified patent and that said Letters Patent is hereby corrected as shown below:

In the Claims

Column 27, line 53, claim 10: After "apply" and before "boosting" insert -- a --

Signed and Sealed this  
Thirtieth Day of June, 2015

Michelle K. Lee  
*Director of the United States Patent and Trademark Office*